US012586538B2

(12) United States Patent
Lee et al.

(10) Patent No.: US 12,586,538 B2
(45) Date of Patent: *Mar. 24, 2026

(54) ELECTRONIC DEVICE

(71) Applicant: InnoLux Corporation, Miao-Li County (TW)

(72) Inventors: Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 19/011,980

(22) Filed: Jan. 7, 2025

(65) Prior Publication Data

US 2025/0148994 A1 May 8, 2025

Related U.S. Application Data

(63) Continuation of application No. 18/442,199, filed on Feb. 15, 2024, now Pat. No. 12,249,287, which is a
(Continued)

(30) Foreign Application Priority Data

Feb. 7, 2017 (CN) .......................... 201710067676.6
Aug. 4, 2017 (CN) .......................... 201710660574.5

(51) Int. Cl.
*G09G 3/3266* (2016.01)
*G06F 3/041* (2006.01)
(Continued)

(52) U.S. Cl.
CPC ......... *G09G 3/3266* (2013.01); *G06F 3/0412* (2013.01); *G06F 3/04164* (2019.05);
(Continued)

(58) Field of Classification Search
CPC .......... G09G 3/3266; G09G 2310/0297; G06F 3/0412; G06F 3/044; H01L 27/124; H01L 23/544; H01L 2223/54426
See application file for complete search history.

(56) References Cited

U.S. PATENT DOCUMENTS

2011/0186847 A1* 8/2011 Kim ................... H10D 30/6739
438/34
2011/0292655 A1* 12/2011 Ing .......................... G09F 13/14
362/241
2015/0243890 A1* 8/2015 Fang .................... H10K 59/122
438/23

* cited by examiner

*Primary Examiner* — Muhammad N Edun
(74) *Attorney, Agent, or Firm* — McClure, Qualey & Rodack, LLP

(57) ABSTRACT

An electronic device includes a first insulating layer and a first connective portion at least partially disposed in the first insulating layer. The electronic device includes a first conductive portion and a second conductive portion. The first conductive portion and the second conductive portion are respectively corresponding to opposite sides of the first insulating layer. The first conductive portion is electrically connected to the second conductive portion through the first connective portion. The electronic device also includes an integrated circuit and a capacitor. The integrated circuit and the capacitor are respectively corresponding to opposite sides of the first insulating layer. The integrated circuit and the capacitor are overlapped with the first connective portion.

20 Claims, 32 Drawing Sheets

Related U.S. Application Data continuation of application No. 18/155,336, filed on Jan. 17, 2023, now Pat. No. 11,935,487, which is a continuation of application No. 17/524,122, filed on Nov. 11, 2021, now Pat. No. 11,580,912, which is a continuation of application No. 16/950,035, filed on Nov. 17, 2020, now Pat. No. 11,195,470, which is a continuation of application No. 16/702,157, filed on Dec. 3, 2019, now Pat. No. 10,872,908, which is a continuation of application No. 15/909,097, filed on Mar. 1, 2018, now Pat. No. 10,529,745, which is a continuation-in-part of application No. 15/640,647, filed on Jul. 3, 2017, now Pat. No. 10,217,416, and a continuation-in-part of application No. 15/451,432, filed on Mar. 7, 2017, now abandoned.

(60) Provisional application No. 62/371,252, filed on Aug. 5, 2016, provisional application No. 62/358,177, filed on Jul. 5, 2016.

(51) Int. Cl.
| | |
|---|---|
| *G06F 3/044* | (2006.01) |
| *H01L 23/544* | (2006.01) |
| *H10D 86/40* | (2025.01) |
| *H10D 86/60* | (2025.01) |

(52) U.S. Cl.
CPC ............ *G06F 3/044* (2013.01); *H01L 23/544* (2013.01); *H10D 86/423* (2025.01); *H10D 86/441* (2025.01); *H10D 86/471* (2025.01); *H10D 86/60* (2025.01); *G09G 2310/0297* (2013.01); *H01L 2223/54426* (2013.01)

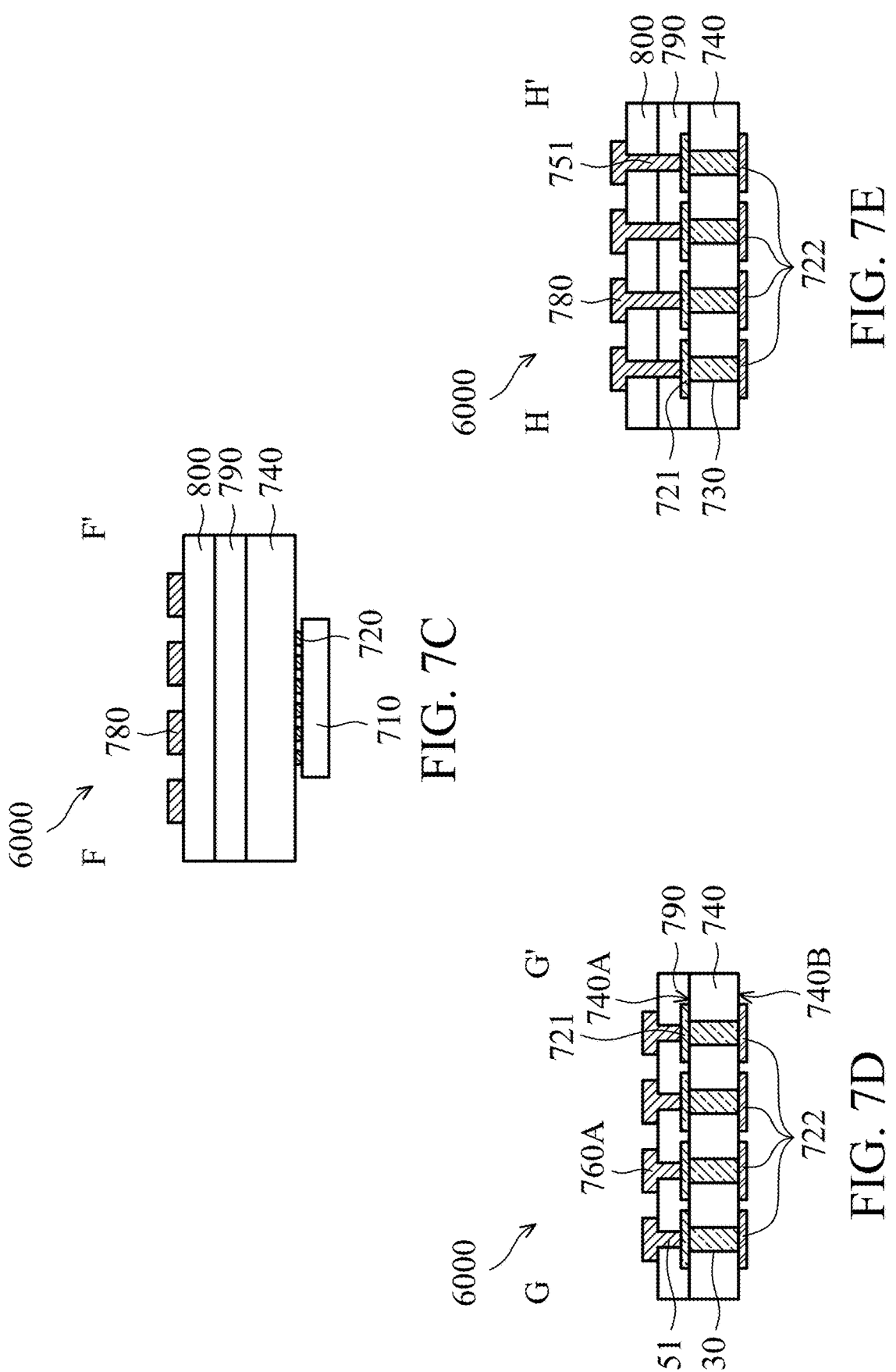

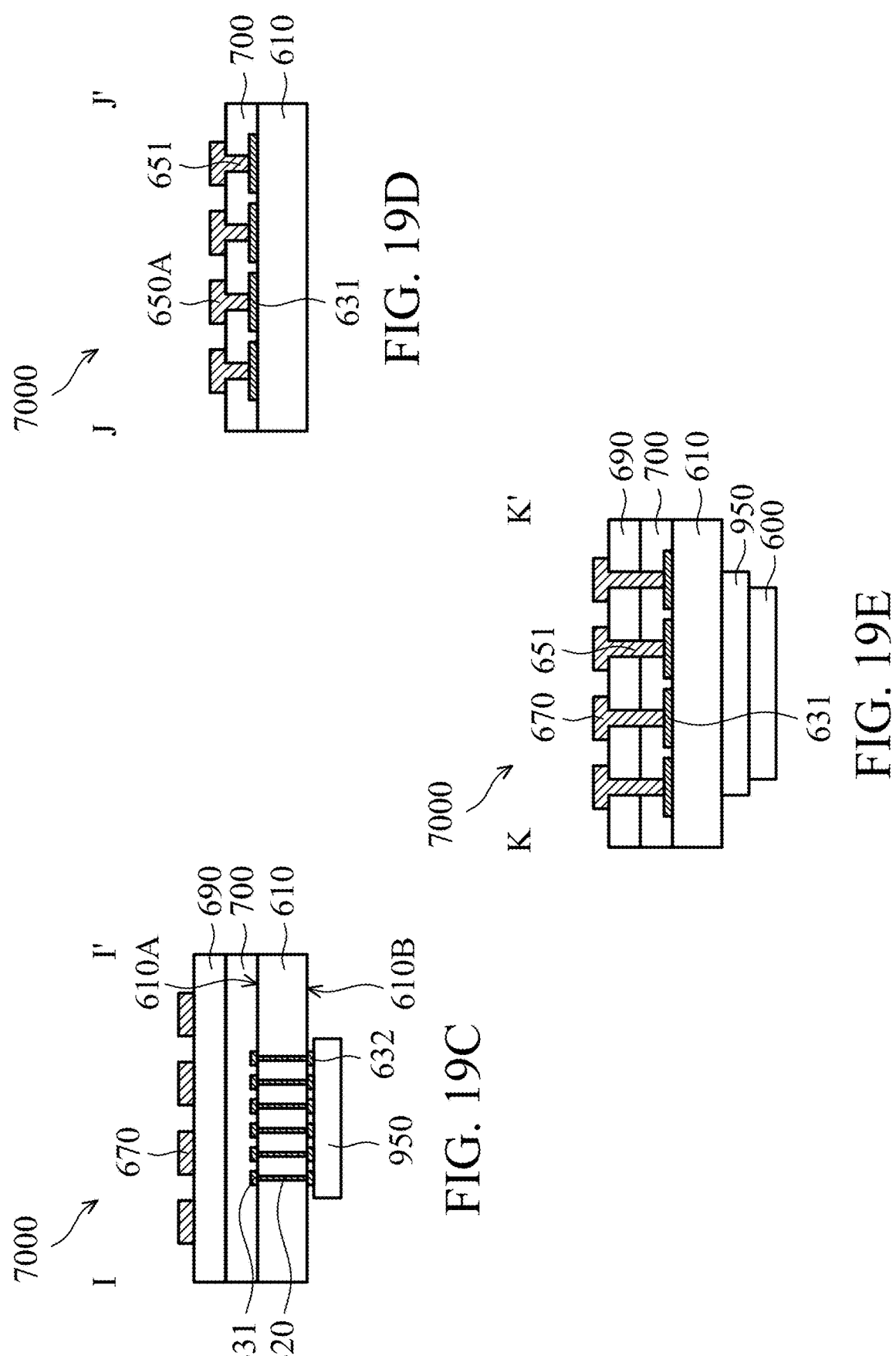

ELECTRONIC DEVICE

CROSS REFERENCE TO RELATED APPLICATIONS

This application is a Continuation of application Ser. No. 18/442,199, filed Feb. 15, 2024 (now U.S. Pat. No. 12,249, 287), which is a Continuation of application Ser. No. 18/155, 336, filed Jan. 17, 2023 (now U.S. Pat. No. 11,935,487), which is a Continuation of application Ser. No. 17/524,122, filed Nov. 11, 2021 (now U.S. Pat. No. 11,580,912), which is a Continuation of application Ser. No. 16/950,035, filed Nov. 17, 2020 (now U.S. Pat. No. 11,195,470, issued on Dec. 7, 2021), which is a Continuation of application Ser. No. 16/702,157, filed Dec. 3, 2019 (now U.S. Pat. No. 10,872,908, issued on Dec. 22, 2020), which is a Continuation of application Ser. No. 15/909,097, filed Mar. 1, 2018 (now U.S. Pat. No. 10,529,745, issued on Jan. 7, 2020), which is a continuation-in-part of U.S. patent application Ser. No. 15/640,647 filed on Jul. 3, 2017 (now U.S. Pat. No. 10,217,416, issued on Feb. 26, 2019), which claims the benefit of priority from a provisional application of U.S. Patent Application No. 62/358,177 filed on Jul. 5, 2016, a provisional application of U.S. Patent Application No. 62/371,252 filed on Aug. 5, 2016 and China Patent Application No. 201710067676.6, filed on Feb. 7, 2017, the application Ser. No. 15/909,097 is also a continuation-in-part of U.S. patent application Ser. No. 15/451,432 filed on Mar. 7, 2017, and claims the benefit of priority of China Patent Application No. 201710660574.5, filed on Aug. 4, 2017, the entirety of which are incorporated by reference herein.

BACKGROUND OF THE INVENTION

Field of the Invention

The present disclosure relates to a display device. More particularly, the present disclosure relates to a display device with a substrate having a connective portion therein.

Description of the Related Art

As digital technologies have progressed, display devices have become widely used in all aspects of daily life. For example, they are widely used in televisions, notebooks, computers, mobile phones, smartphones, and other modern information equipment. In the present display device, the processing unit and the display unit are formed on the same surface of the substrate, and the boundary of the non-display area is large, so that the effective display space is limited.

BRIEF SUMMARY

The present disclosure provides an electronic device, which includes a first insulating layer and a first connective portion at least partially disposed in the first insulating layer. The electronic device includes a first conductive portion and a second conductive portion. The first conductive portion and the second conductive portion are respectively corresponding to opposite sides of the first insulating layer. The first conductive portion is electrically connected to the second conductive portion through the first connective portion. The electronic device also includes an integrated circuit and a capacitor. The integrated circuit and the capacitor are respectively corresponding to opposite sides of the first insulating layer. The integrated circuit and the capacitor are overlapped with the first connective portion.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A-2E are illustrations of various stages of a process for forming a connective portion in a substrate, in accordance with some embodiments, wherein FIGS. 2A-2D are perspective views and FIG. 2E is a cross-sectional view;

FIGS. 3A-3F are illustrations of various stages of a process for forming a connective portion in a substrate, in accordance with some embodiments, wherein FIGS. 3A-3E are perspective views and FIG. 3F is a cross-sectional view;

FIG. 7C is a cross-sectional view taken along line F-F' of FIG. 7B, in accordance with some embodiments;

FIG. 7D is a cross-sectional view taken along line G-G' of FIG. 7B, in accordance with some embodiments;

FIG. 7E is a cross-sectional view taken along line H-H' of FIG. 7B, in accordance with some embodiments;

FIG. 10A is a cross-sectional view taken along line A-A' of the display device shown in FIG. 9, in accordance with some embodiments;

FIG. 10B is a cross-sectional view taken along line B-B' of the display device shown in FIG. 9, in accordance with some embodiments;

FIG. 19C is a cross-sectional view taken along line C-C' of FIG. 6B, in accordance with some embodiments;

FIG. 19D is a cross-sectional view taken along line D-D' of FIG. 6B, in accordance with some embodiments;

FIG. 19E is a cross-sectional view taken along line E-E' of FIG. 6B, in accordance with some embodiments;

DETAILED DESCRIPTION OF THE INVENTION

Figure 1:
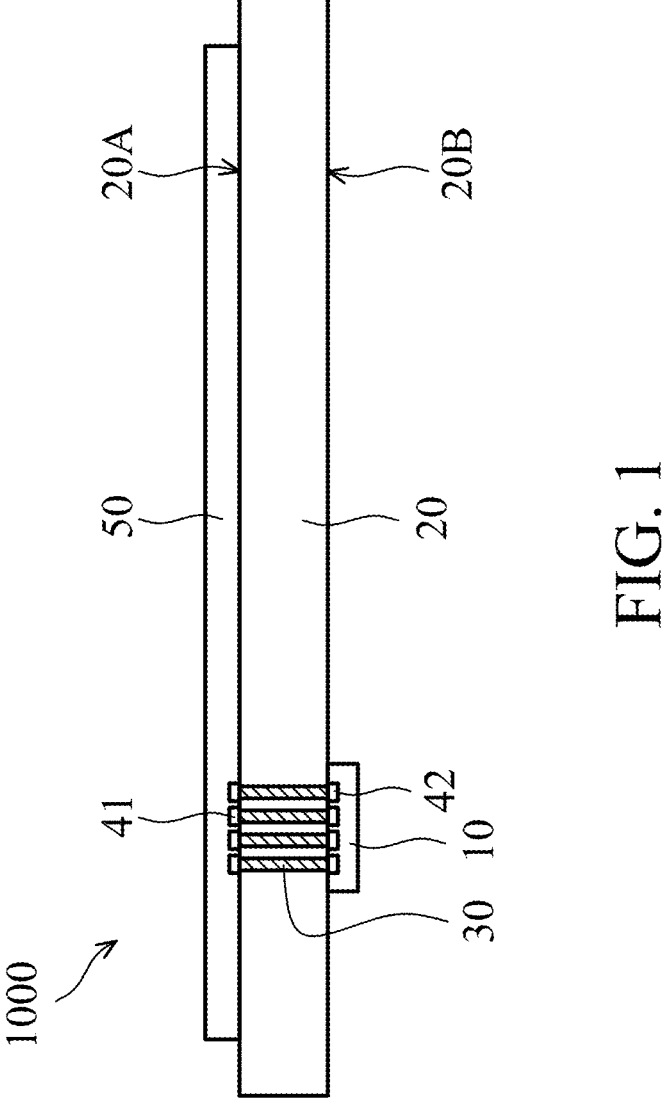
FIG. 1 is a cross-sectional view of a display device in accordance with some embodiments of the disclosure.

The display device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The term "substrate" is meant to include devices formed within a transparent substrate and the layers overlying the transparent substrate. All transistor element needed may be already formed on the substrate. However, the substrate is represented with a flat surface in order to simplify the drawing. The term "substrate surface" is meant to include the uppermost exposed layers on a transparent substrate, such as an insulating layer and/or metallurgy lines.

At first, referring to FIG. 1, FIG. 1 is a cross-sectional view of a display device 1000 in accordance with some embodiments of the disclosure. The display device 1000 includes a processing unit 10, a substrate 20 and a display element layer 50. The processing unit 10 may include, but is not limited to, an integrated circuit (IC), a microprocessor, a memory device, other elements processing signal or a combination thereof. The substrate 20 may be a transparent substrate, such as a glass substrate, a ceramic substrate, a plastic substrate or another applicable substrate. The substrate 20 may be a hard substrate or a flexible substrate. The display element layer 50 may include, but is not limited to, a gate driver circuit, a data line, a thin film transistor, a light-emitting layer, a capacitor, an inductor, a passive micro-electronic element, an active micro-electronic element or a combination thereof.

In some embodiments, as shown in FIG. 1A, the substrate 20 has a first surface 20A and a second surface 20B opposite to the first surface 20A. A first conductive layer 41 is disposed on the first surface 20A, and a second conductive layer 42 is disposed on the second surface 20B. The processing unit 10 is disposed on the second surface 20B and electrically connected to the second conductive layer 42. A first connective portion is at least partially disposed in the substrate 20, and penetrates from the first surface 20A to the second surface 20B. The first conductive layer 41 is electrically connected to the display element layer 50. The processing unit 10 is electrically connected to first conductive layer 41 through a first connective portion 30, and thereby the signal from the processing unit 10 is transmitted to the display element layer 50.

Referring to FIGS. 2A-2E, FIGS. 2A-2E are illustrations of various stages of a process for forming a connective portion penetrating the substrate, in accordance with some embodiments. The following process may be applied in forming the first connective portion in the present disclosure, in accordance with some embodiments. At first, referring to FIG. 2A, a first carrier substrate 100 is provided, and multiple pillars 110 are disposed on the first carrier substrate 100.

Figure 2A:
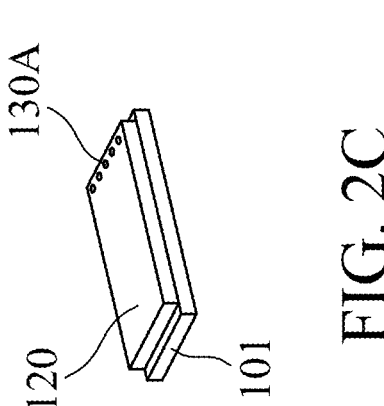
Figure 2B:
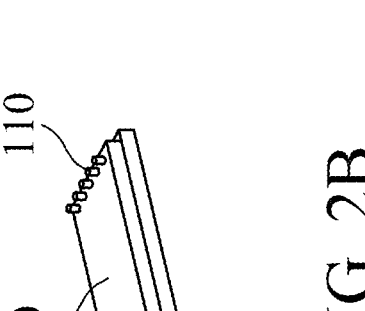

Next, referring to FIG. 2B, a deposition process is used, and the substrate 120 is formed on the first carrier substrate 100 such that the multiple pillars 110 protrude on the substrate 120. The material of the substrate 120 may be a glass, a photo sensitive material, a polymer resin or another applicable material. The substrate 120 may be a hard substrate or a flexible substrate.

Figure 2C:
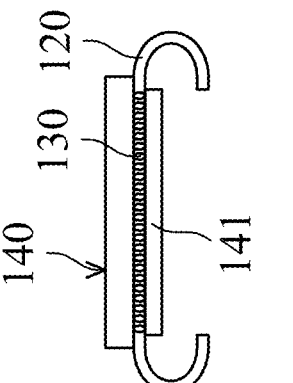

Next, the first carrier substrate 100 having multiple pillars 110 is removed, and the substrate 120 having multiple through holes 130A is formed. Afterwards, as shown in FIG. 2C, the substrate 120 is transferred to a second carrier substrate 101.

Figure 2D:
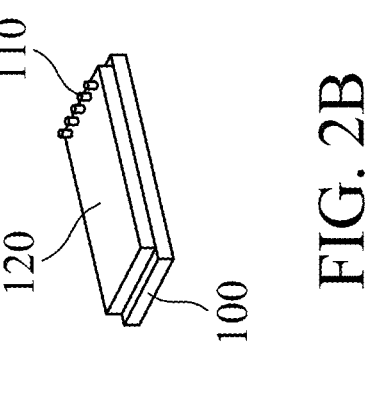

Next, as shown in FIG. 2D, a deposition process is used, and a conductive material is filled into the multiple through holes 130A, such that multiple first connective portions 130A is formed. Furthermore, a display element layer 140 is formed on the substrate 120, and then the second carrier substrate 101 is removed.

Figure 2E:
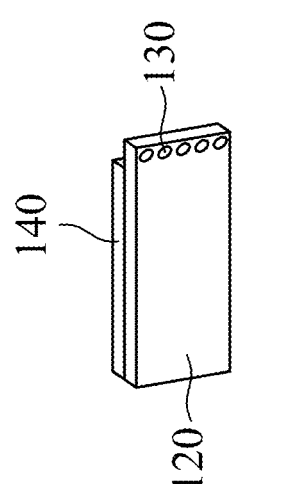

Finally, as shown in FIG. 2E, the processing unit 141 is disposed, and the edges of the substrate 120 are bent. According to other embodiments, the edges of the substrate 120 are not bent. In this embodiment, the substrate 120 has multiple first connective portions 130. Therefore, the processing unit 141 is electrically connected to the display element layer 140 or another electronic element through these first connective portions 130.

Referring to FIGS. 3A-3F, FIGS. 3A-3F are illustrations of various stages of a process for forming a connective portion penetrating the substrate, in accordance with some embodiments. The following process may be applied in forming the first connective portion in the present disclosure, in accordance with some embodiments. At first, referring to FIG. 3A, a first carrier substrate 100 is provided, and a buffer layer 150 is disposed on the first carrier substrate 100. The buffer layer 150 may include, but is not limited to, silicon dioxide, silicon nitride, silicon oxynitride or another applicable insulation material.

Figure 3C:
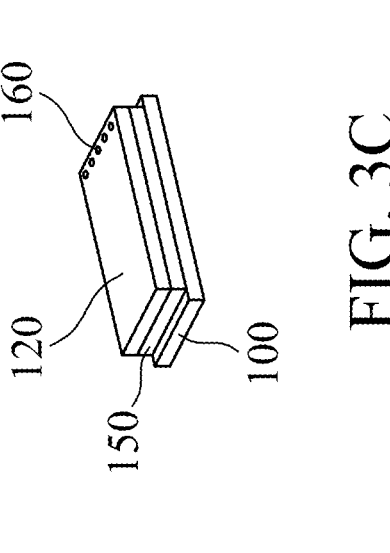
Figure 3F:
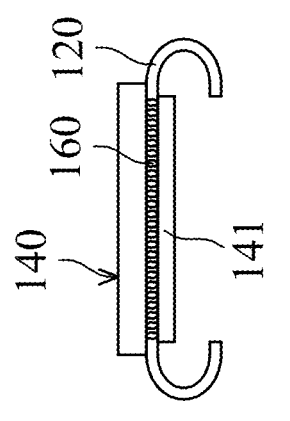
Figure 3F:
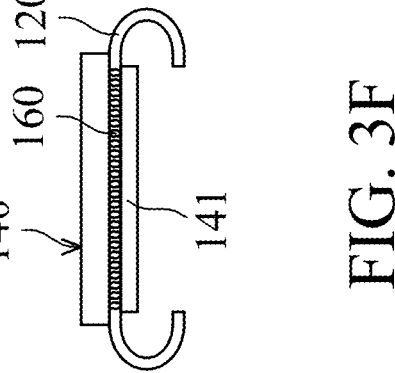
Figure 3B:
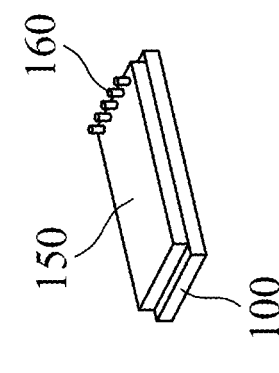

Next, referring to FIGS. 3B-3C, a deposition process and a photolithography process are used to form the conductive pillars 160 made by a conductive material on the buffer layer 150. A deposition process is used to form a substrate 120 on the buffer layer 150, and the conductive pillars 160 are covered by the substrate 120. The conductive pillars 160 may be formed by metal pillars. The substrate 120 may be a hard substrate or a flexible substrate.

Figure 3E:
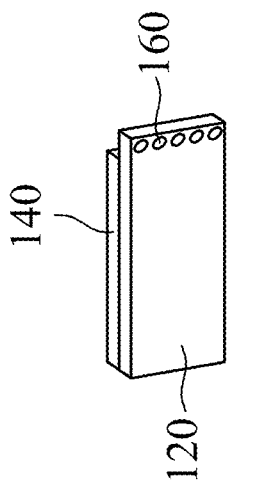
Figure 3E:
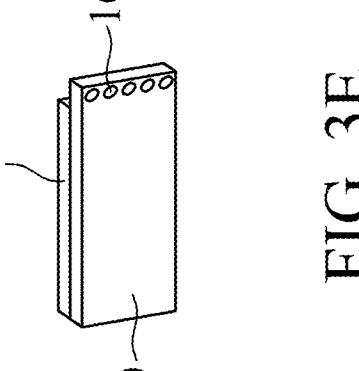
Figure 3A:
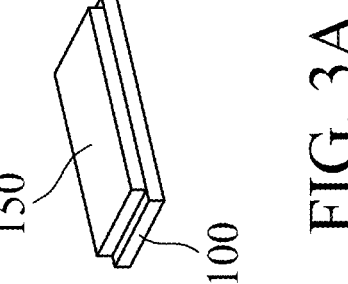
Figure 3D:
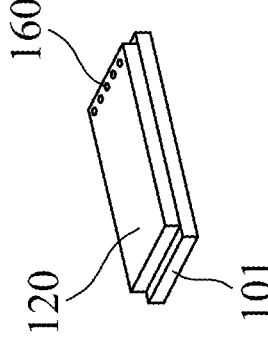

Next, as shown in FIG. 3D, the buffer layer 150 and the first carrier substrate 100 are removed, and the substrate 120 is transferred to a second carrier substrate 101. As a result, the substrate 120 has multiple conductive pillars 160 therein.

Next, as shown in FIG. 3E, a display element layer 140 is formed on the substrate 120.

Finally, as shown in FIG. 3F, a processing unit 141 is disposed, and the edges of the substrate 120 are bent. According to other embodiments, the edges of the substrate 120 are not bent. In this embodiment, the substrate 120 has multiple first connective portions 160 made by conductive pillars. Therefore, the processing unit 141 is electrically connected to a display element layer 140 or other electronic elements through these first connective portions 160.

Figures 4A, 4B, 4C, 4D, 4E:
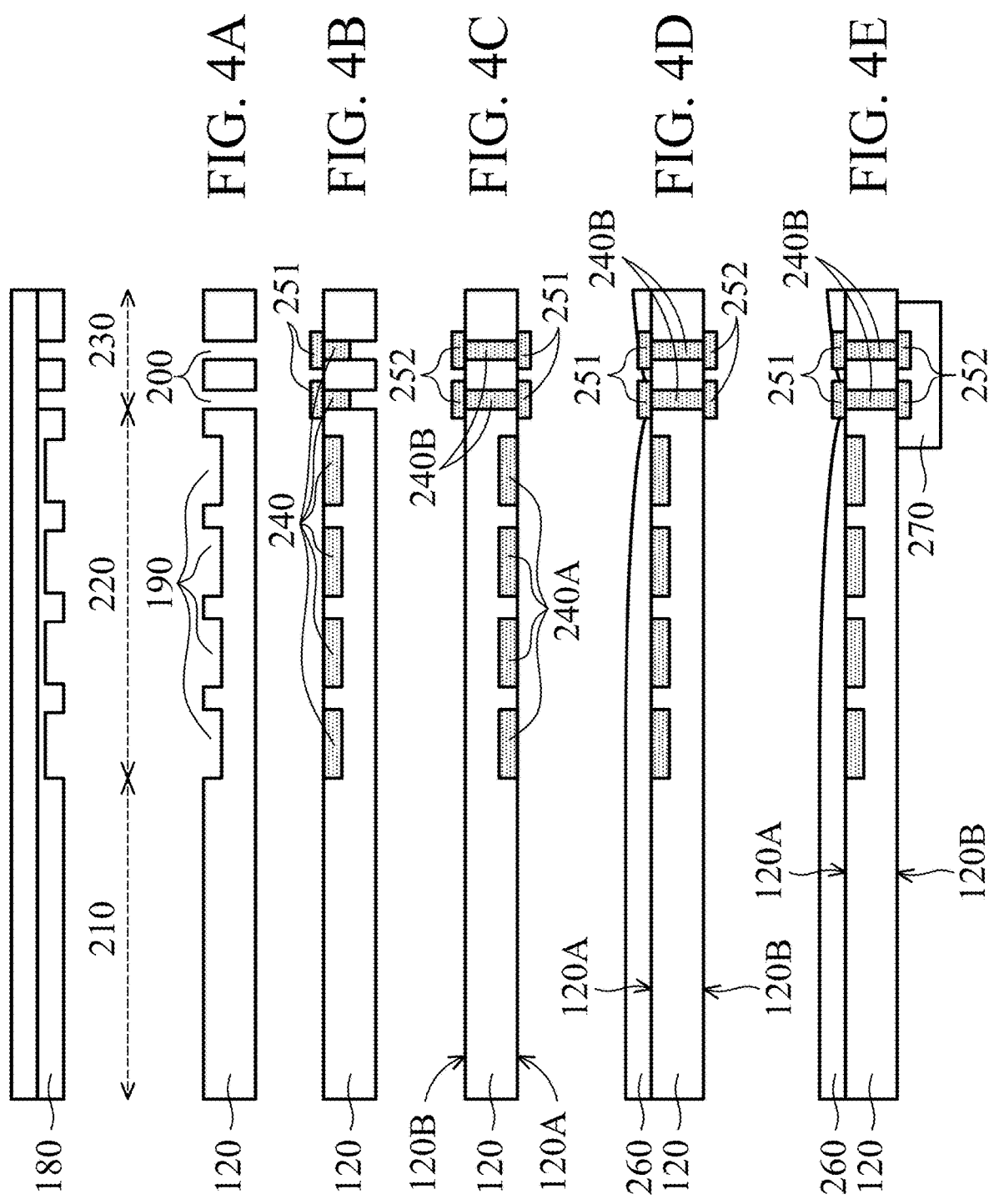
FIGS. 4A-4E are cross-sectional views of various stages of a process for forming a substrate having through holes and blind holes, in accordance with some embodiments.

Referring to FIGS. 4A-4E, FIGS. 4A-4E are cross-sectional views of various stages of a process for forming through holes 200 and blind holes 190 in a substrate, in accordance with some embodiments. At first, as shown in FIG. 4A, a substrate 120 is provided. The substrate 120 includes an active region 210, a bending region 220 and a gate driver circuit region 230. In some embodiments, a half-tone mask 180 is used to pattern the substrate 120 so that the substrate 120 has through holes 200 and blind holes 190. As shown in FIG. 4A, the through holes 200 penetrate through the substrate 120, and the blind holes 190 do not penetrate through the substrate 120. In some embodiments, the blind holes 190 are formed, but are not limited to, in the bending regions 220, and the through holes 200 are formed, but are not limited to, in the gate driver circuit region 230. The depth of the blind holes 190 is not limited. In some embodiments, the depth of the blind holes 190 is less than half of the depth of the substrate 120.

Next, as shown in FIGS. 4B-4C, a conductive material (such as a metal material) 240 is deposited into the through holes 200 and the blind holes 190. In some embodiments, when the conductive material 240 is deposited until half of the depth of the through holes 200 is filled, the substrate 120 is flipped. Afterwards, the conductive material 240 is deposited until the conductive material 240 is filled on the through holes 200. As a result, as shown in FIG. 4C, a first connective portions 240B filled in the though holes 200 are formed, and the conductive layer 240A, made by filling the conductive material into the blind holes 190, is formed. In addition, the first conductive layer 251, used as first conductive pads on the first surface 120A of the substrate 120, is formed. The second conductive layer 252, used as second conductive pads on the second surface 120B of the substrate 120, is formed.

Next, as shown in FIGS. 4D-4E, a display element layer 260 is formed on the first surface 120A which has the first conductive layer 251. A processing unit 270 is formed on the second surface 120B of the substrate 120. The second surface 120B has a second conductive layer 252. The display element layer 260 is electrically connected to the first conductive layers 251, and the processing unit 270 is electrically connected to the second conductive layers 252.

In some embodiments, the conductive layer 240A, the first connective portion 240B, the first conductive layer 251 and the second conductive layer 252 are made of the same conductive material 240. In some embodiments, the conductive material 240 may include copper, aluminum, molybdenum, tungsten, gold, chromium, nickel, platinum, titanium, iridium, rhodium, the above alloys, another applicable metal conductive material, or a combination thereof.

Figures 5A, 5B:
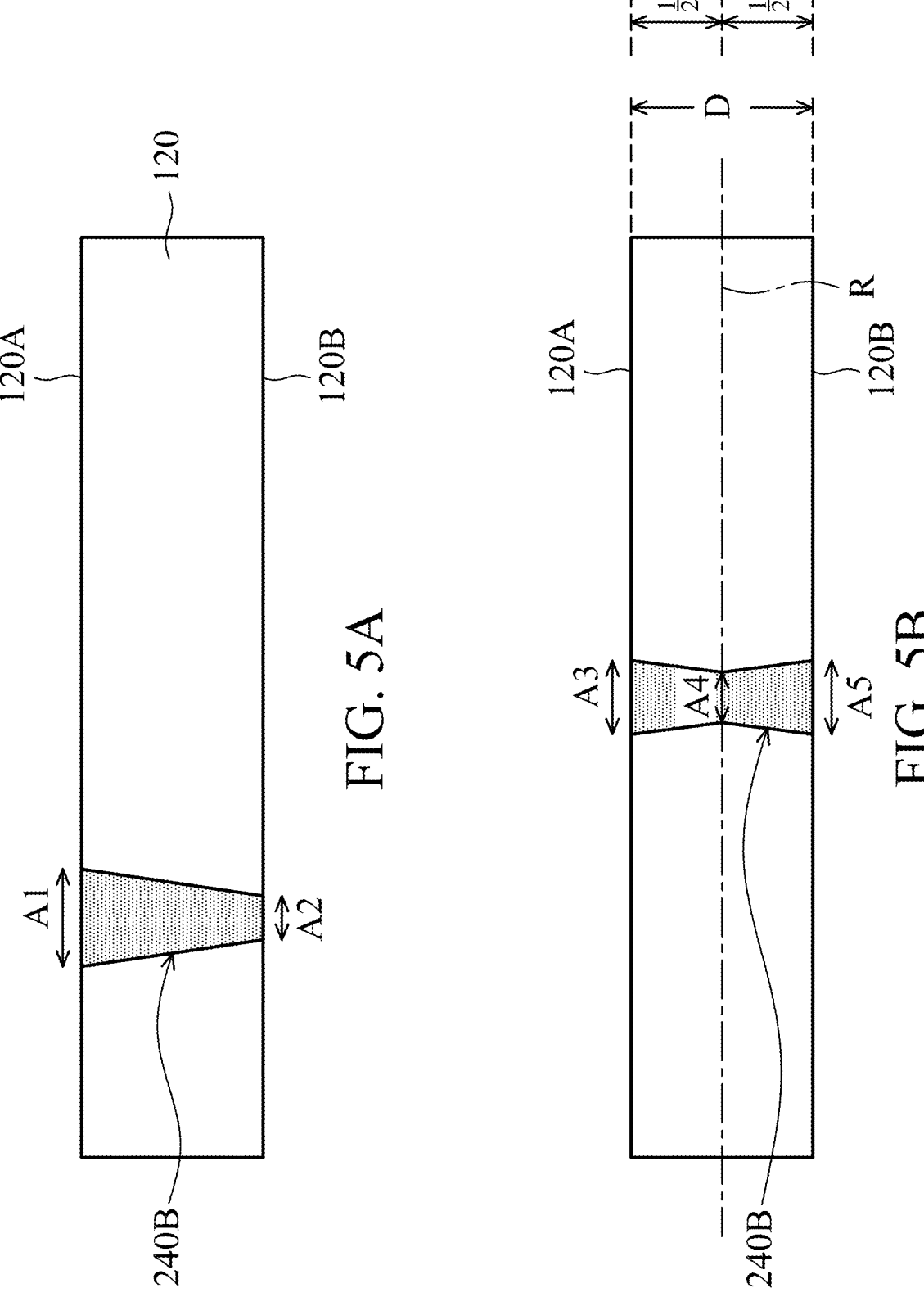
FIGS. 5A-5B are cross-sectional views of a substrate and through holes, in accordance with some embodiments.

FIG. 5A is a cross-sectional view of a substrate 120 and a first connective portion 240B, in accordance with some embodiments. As shown in FIG. 5A, the first connective portion 240B has a first width A1 along the first surface 120A and a second width A2 along the second surface 120B. In some embodiments, the first width A1 is different from the second width A2. For example, the first width A1 is greater than the second width A2, raising the yield for forming the first connective portion and reducing breakage of the connective portion.

FIG. 5B is a cross-sectional view of a substrate 120 and a first connective portion 240B, in accordance with some embodiments. As shown in FIG. 5B, the first connective portion 240B has a first width A3 along the first surface 120A and a second width A5 along the second surface 120B. The first width A3 may be the same as or different from the second width A5. The first connective portion 240B further has a third width A4 along a reference plane R. In some embodiments, the reference plane R is located between the first surface 120A and the second surface 120B, and the reference plane R is parallel to the first surface 120A. In some embodiments, as shown in FIG. 5B, the reference plane R is located between the first surface 120A and the second surface 120B and is one half of D away from the first surface 120A. D is the thickness of the substrate 120. In some embodiments, the first width A3 is different from the third width A4. For example, the first width A3 is greater than the third width A4, raising the yield for forming the first connective portion and reducing breakage of the connective portion.

Figure 6A:
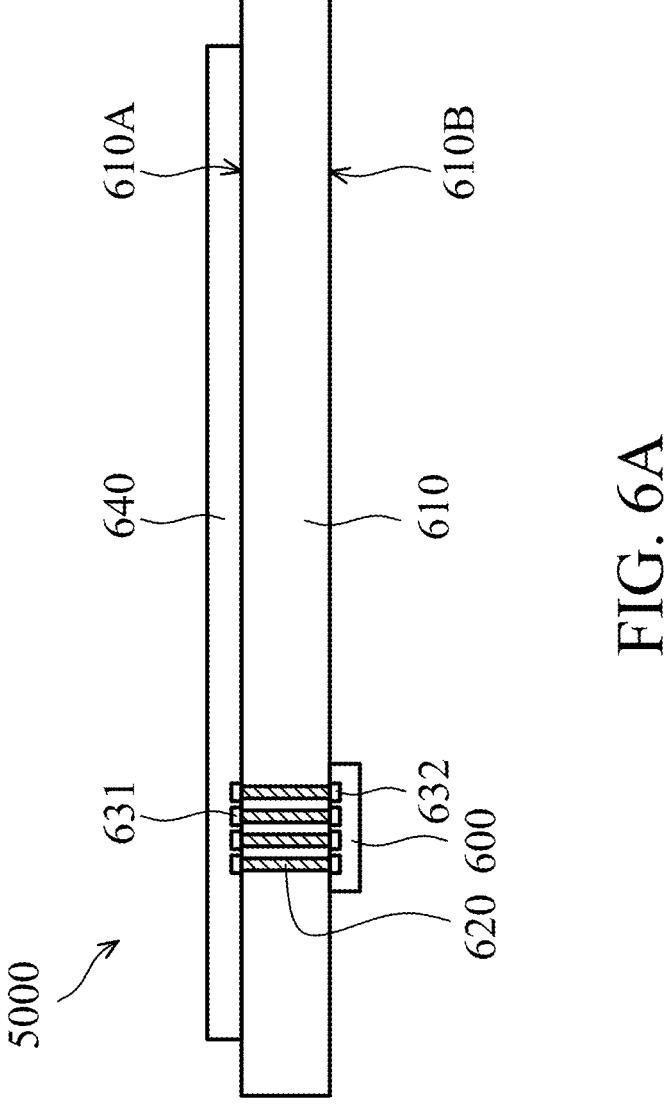
FIG. 6A is a cross-sectional view of a display device, in accordance with some embodiments.

Referring to FIG. 6A, FIG. 6A is a cross-sectional view of a display device 5000, in accordance with some embodiments. The display device 5000 includes a processing unit 600, a substrate 610 and a display element layer 640. The substrate 610 has a first surface 610A and a second surface 610B opposite to the first surface 610A. Generally, the first surface 610A is called a front side of the substrate, and the second surface 610B is called a backside of the substrate. The display element layer 640 is disposed on the first surface 610A. A first conductive layer 631 is formed on the first surface 610A, and a second conductive layer 632 is formed on the second surface 610B. The processing unit 600 is disposed on the second surface 610B and electrically connected to the second conductive layer 632. The first connective portion 620 is at least partially disposed in the substrate 610, and penetrates from the first surface 610A to the second surface 610B. The first conductive layer 631 is electrically connected to the second conductive layer 632 by the first connective portion 620, and thereby the signal of the processing unit 600 is transmitted to the display element layer 640. The processing unit 600 may include, but is not limited to, an integrated circuit (IC), a microprocessor, a memory device, other elements processing signal, or a combination thereof.

Figure 6B:
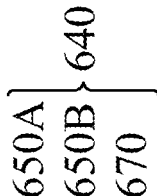
FIG. 6B is a top view of a circuit layout of a display device shown in FIG. 6A, in accordance with some embodiments.

Referring to FIG. 6B, FIG. 6B is a top view of a circuit layout of the display device 5000 shown in FIG. 6A, in accordance with some embodiments. It should be noted that FIG. 6B only illustrates the processing unit 600, the first connective portion 620 and other circuits disposed in the display element layer 640 for brevity. As shown in FIG. 6B, the display element layer 640 includes a gate driver circuit 650 and a data line 670. The gate driver circuit 650 includes a display signal line 650A (such as an input signal circuit) extending along a first direction (such as the Y direction) and an output signal circuit 650B (such as a scan line) extending along a second direction (such as the X direction). The gate driver circuit 650 and the data line 670 are formed on the first surface 610A. In some embodiments, the processing unit 600 is electrically connected to the display signal line 650A of the gate driver circuit 650 through the multiple first connective portions 620 and the first conductive layer 631. The signal of the processing unit 600 is further transmitted to the data line 670, which extends along first direction (Y direction), through the output signal circuit 650B of the gate driver circuit 650. In this embodiment, the extending direction of the first connective portion 620 is perpendicular to the first direction and the second direction.

Figures 6C, 6D, 6E:
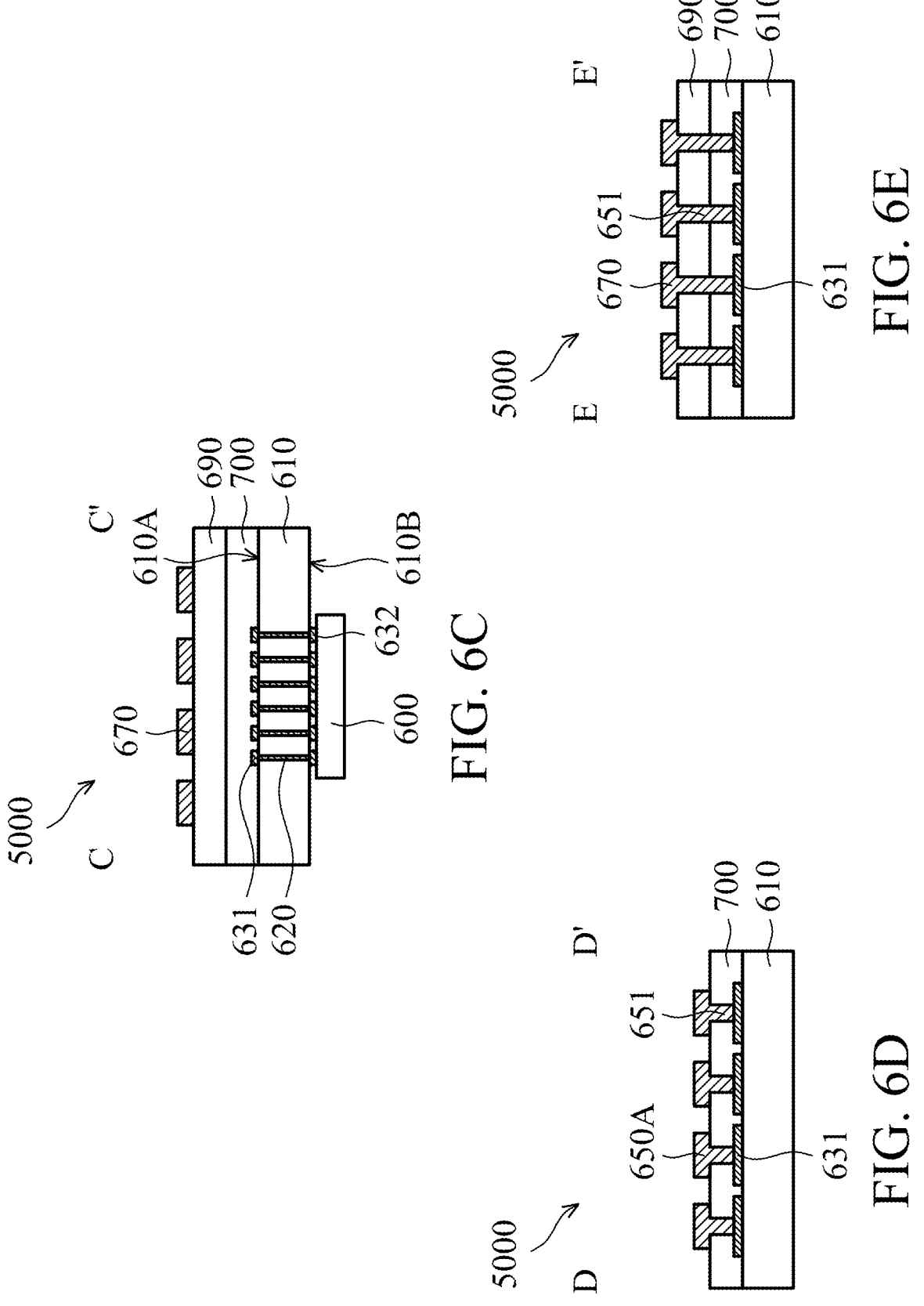
FIG. 6C is a cross-sectional view taken along line C-C' of FIG. 6B, in accordance with some embodiments.
FIG. 6D is a cross-sectional view taken along line D-D' of FIG. 6B, in accordance with some embodiments.
FIG. 6E is a cross-sectional view taken along line E-E' of FIG. 6B, in accordance with some embodiments.

Referring to FIGS. 6C-6E, FIG. 6C is a cross-sectional view taken along line C-C', FIG. 6D is a cross-sectional view taken along line D-D', and FIG. 6E is a cross-sectional view taken along line E-E' of the display device 5000 shown in FIG. 6B, in accordance with some embodiments. As shown in FIG. 6C, a first insulation layer 700 is disposed on the first conductive layer 631, a second insulation layer 690 is disposed on the first insulation layer 700, and the data line 670 is disposed on the second insulation layer 690. As shown in FIG. 6D, a second connective portion 651 is at least partially disposed in the first insulation layer 700 and penetrates through the first insulation layer 700. The display signal line 650A is disposed on the first insulation layer 700. The gate driver circuit 650 is electrically connected to the first conductive layer 631. For example, the display signal line 650A of the gate driver circuit 650 is electrically connected to the first conductive layer 631 through the second connective portion 651. As shown in FIG. 6E, the second connective portion 651 is disposed in the first insulation layer 700 and the second insulation layer 690, and penetrates through the first insulation layer 700 and the second insulation layer 690. The data line 670 is electrically connected to the first conductive layer 631 through the second connective portion 651.

Referring to FIG. 6C, in some embodiments, the (greatest) width of the first conductive layer 631 along the C-C' direction is greater than the (greatest) width of the first connective portion 620 along the C-C' direction, and the (greatest) width of the second conductive layer 632 along the C-C' direction is greater than the (greatest) width of the first connective portion 620 along the C-C' direction. The first conductive layer 631 and second conductive layer 632 may be used as conductive pads, and it can ensure good conductive effectiveness with a greater width. In some embodiments, the position of the processing unit 600 corresponds to that of the first connective portion 620. For example, from a view in a direction perpendicular to the first surface 610A of the substrate 610, the processing unit 600 at least partially overlaps the first connective portion 620, and the first connective portion 620 at least partially overlaps the first conductive layer 631 or the second conductive layer 632.

Figure 6F:
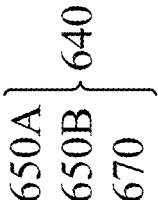
FIG. 6F is top view of a variation of a display device shown in FIG. 6B, in accordance with some embodiments.

FIG. 6F is a variation of the display device 5000 shown in FIG. 6B. As shown in FIG. 6F, the display device 5000 further includes a demultiplexer 660 which is disposed on the first surface 610A and electrically connected to the first conductive layer 631. One signal line from the processing unit 600 may be selectively distributed to one of multiple outputs through the demultiplexer 660. For example, as shown in FIG. 6F, one signal line from the processing unit 600 may be selectively distributed to one of three data lines through the demultiplexer 660. In FIG. 6B, three first connective portions 620 are needed to correspond to the three data lines. With the design of FIG. 6F, just one connective portion 620 is needed to correspond to the three data lines 670. As a result, the number of required first connective portions 620 is reduced. The description of the cross-sectional view of FIG. 6F is similar to that of FIGS. 6C-6E, and is omitted for brevity.

Figure 7A:
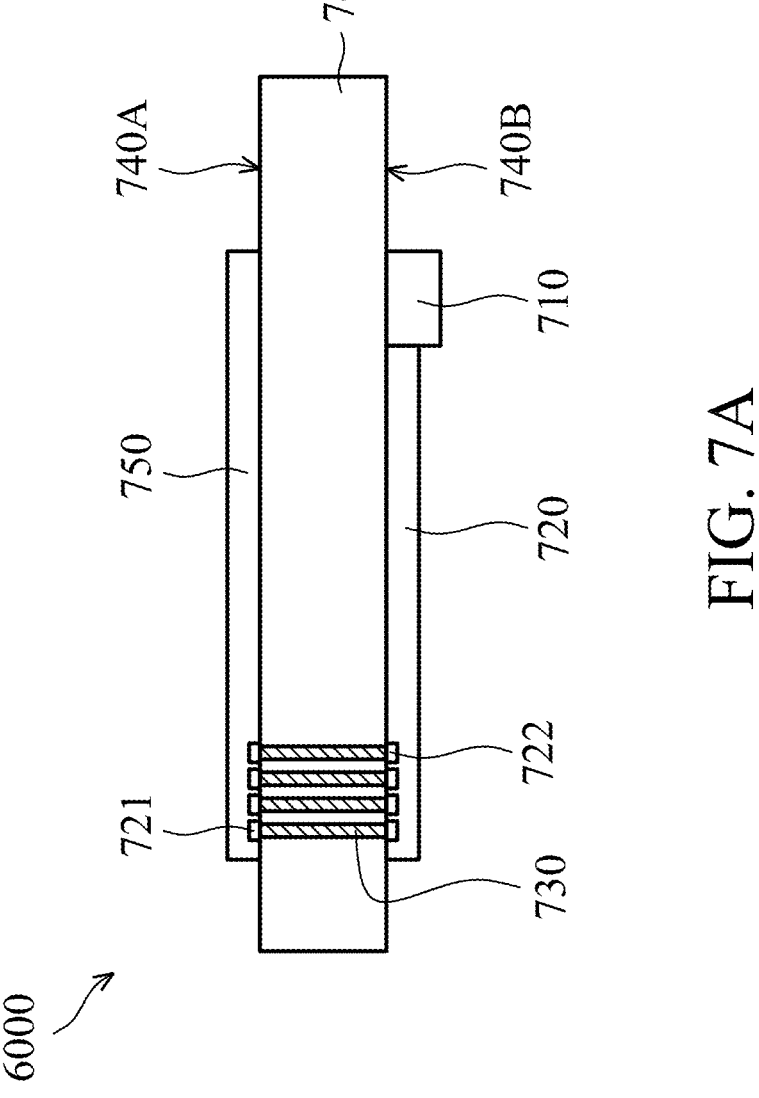
FIG. 7A is a cross-sectional view of a display device, in accordance with some embodiments.

Referring to FIG. 7A, FIG. 7A is a cross-sectional view of a display device 6000, in accordance with other embodiments. The display device 6000 includes a processing unit 710, a substrate 740 and a display element layer 750. The substrate 740 has a first surface 740A and a second surface 740B opposite to the first surface 740A. The display element layer 750 is disposed on the first surface 740A. A first conductive layer 721 is disposed on the first surface 740A, and a second conductive layer 722 is disposed on the second surface 740B. The processing unit 710 is disposed on the second surface 740B and electrically connected to the second conductive layer 722. The first connective portion 730 is at least partially disposed in the substrate 740, and penetrates from the first surface 740A to the second surface 740B. The first conductive layer 721 is electrically connected to the second conductive layer 722 by the first connective portion 730, and thereby the signal of the processing unit 710 is transmitted to the display element layer 750.

In this embodiment, from a direction perpendicular to the first surface 740A of the substrate 740, the processing unit 710 does not overlap with the first connective portion 730. That is to say, the processing unit 740 is separated from the first connective portion 730 from a view in the direction perpendicular to the first surface 740A of the substrate 740. The processing unit 710 is electrically connected to the first connective portion 730 through a wire 720 and the second conductive layer 722, and the first connective portion 730 is electrically connected to the display element layer 750 through the first conductive layer 721.

Figure 7B:
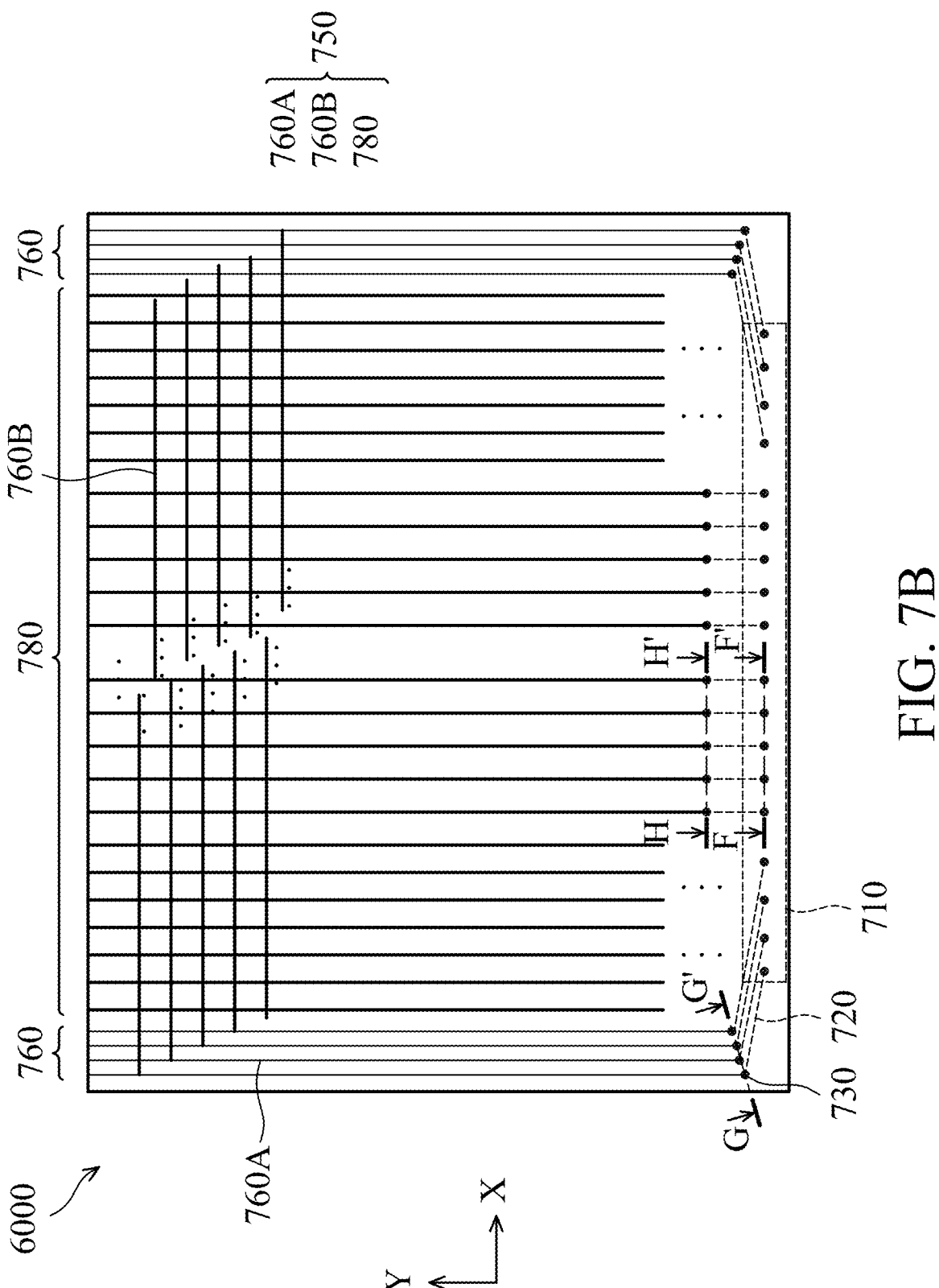
FIG. 7B is a top view of a circuit layout of a display device shown in FIG. 7A, in accordance with some embodiments.

Referring to FIG. 7B, FIG. 7B is a top view of a circuit layout of the display device 6000 shown in FIG. 7A, in accordance with some embodiments. It should be noted that FIG. 7B only illustrates the processing unit 710, the wire 720, the first connective portion 730 and other circuits disposed in the display element layer 750 for brevity. As shown in FIG. 7B, the display element layer 750 includes a gate driver circuit 760 and a data line 780. The gate driver circuit 760 includes a display signal line 760A (such as an input signal circuit) extending along a first direction (such as Y direction) and an output signal circuit 760B (such as a scan line) extending along a second direction (such as X direction). In some embodiments, the processing unit 710 is electrically connected to a first connective portion 730 through multiple wires 720. In this embodiment, the processing unit 710 is electrically connected to the display signal line 760A of the gate driver circuit 760 through the wires 720, and subsequently through the first connective portion 730.

Referring to FIGS. 7C-7E, FIG. 7C is a cross-sectional view taken along line F-F', FIG. 7D is a cross-sectional view taken along line G-G', and FIG. 7E is a cross-sectional view taken along line H-H' of the display device 6000 shown in FIG. 7B, in accordance with some embodiments. As shown in FIG. 7D, a first insulation layer 790 is disposed on the first conductive layer 721, and a second connective portion 751 is at least partially disposed in the first insulation layer 790 and penetrates through the first insulation layer 790. The display signal line 760A is disposed on the first insulation layer 790. The gate driver circuit 760 is electrically connected to the first conductive layer 721. For example, the display signal line 760A of the gate driver circuit 760 is electrically connected to the first conductive layer 721 through the second connective portion 751.

As shown in FIG. 7E, a second insulation layer 800 is disposed on the first insulation layer 790. The second connective portion 751 is disposed in the first insulation layer 790 and the second insulation layer 800, and penetrates the first insulation layer 790 and the second insulation layer 800. A data line 780 is electrically connected to the first conductive layer 721 through the second connective portion 751. In some embodiments, the first connective portion 730 at least partially overlaps the second connective portion 751. As shown in FIGS. 7A and 7C, from a direction perpendicular to the substrate 740, the first connective portion 730 is not disposed directly on the processing unit 710, and the processing unit 710 is electrically connected to the first connective portion 730 through the wires 720.

Figure 7F:
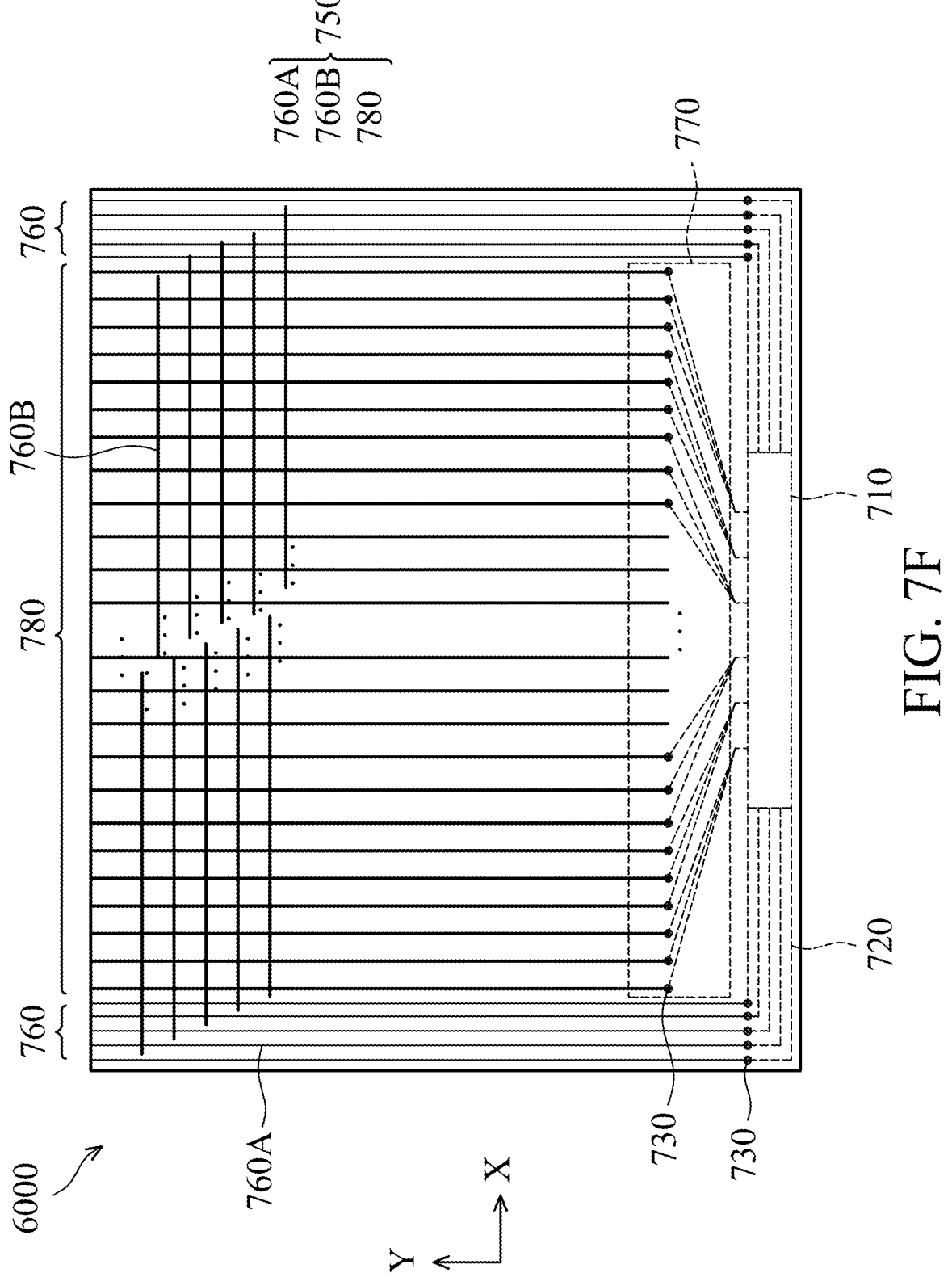
FIG. 7F is top view of a variation of a display device shown in FIG. 7B, in accordance with some embodiments.

FIG. 7F is a variation of the display device 6000 shown in FIG. 7B. As shown in FIG. 7F, the display device 6000 further includes a demultiplexer 770 which is disposed on the second surface 740B of the substrate 740, and electrically connected to the second conductive layer 722. One signal line from the processing unit 710 may be selectively distributed to one of multiple outputs through the demultiplexer 770. For example, as shown in FIG. 7F, one signal line from the processing unit 710 may be selectively distributed to one of three data lines through the demultiplexer 770. In FIG. 7B, three first connective portions 730 are needed to correspond to the three data lines. With the design of FIG. 7F, just one connective portion 730 is needed to correspond to the three data lines 780. As a result, the required number of first connective portions 730 is reduced. The description of the cross-sectional view of FIG. 7F is similar to that of FIGS. 7C-7E, and is omitted for brevity.

Figure 8:
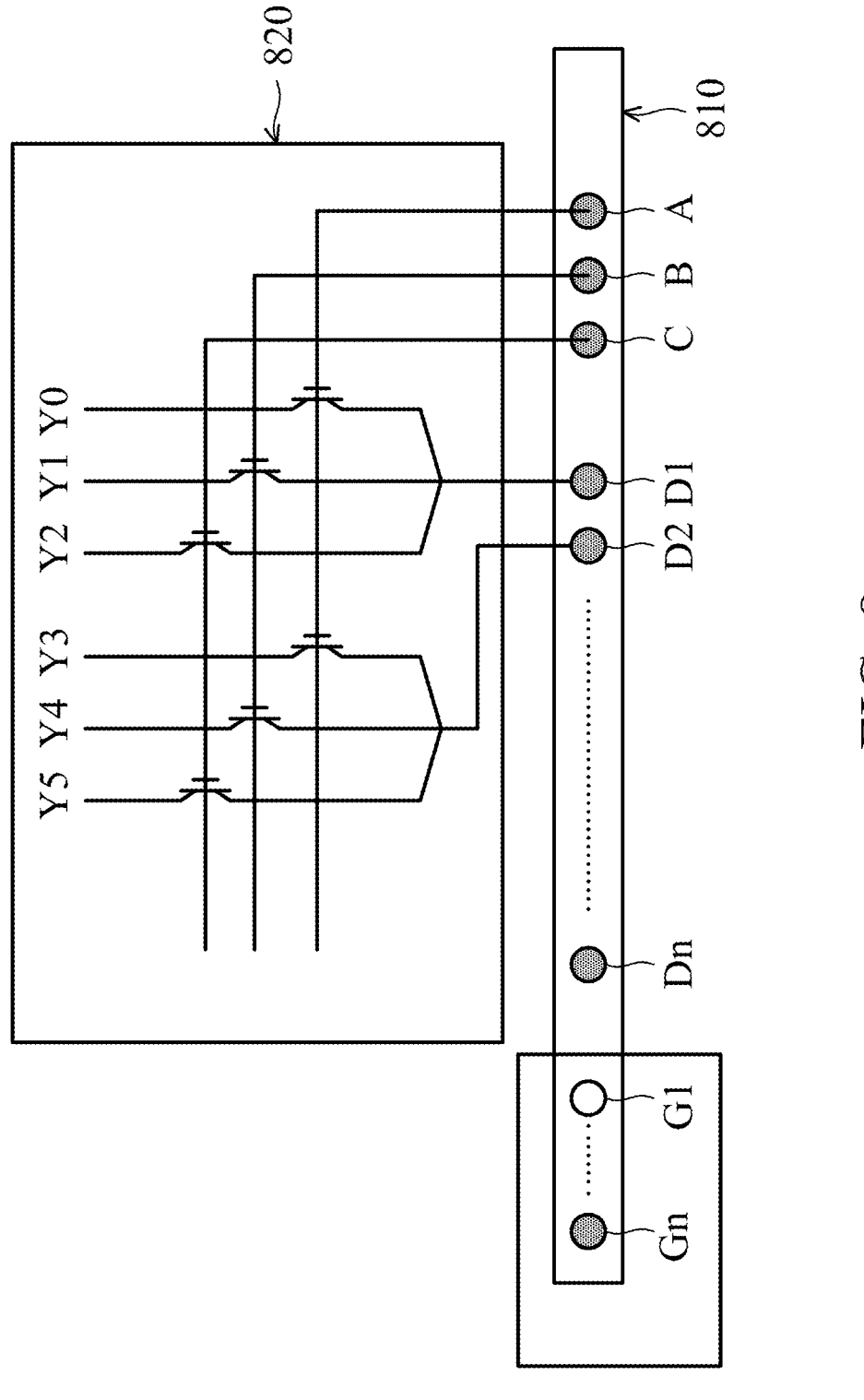
FIG. 8 is a circuit diagram of a demultiplexer, in accordance with some embodiments.

Referring to FIG. 8, FIG. 8 is a circuit diagram of a demultiplexer 820, in accordance with some embodiments. The demultiplexer 660 shown in FIG. 6F and the demultiplexer 770 shown in 7F may have the circuit diagram of the demultiplexer 820 shown in FIG. 8. The diagram and the principle of the demultiplexer 660 are similar to those of the demultiplexer 770, and the following description uses the demultiplexer 660 shown in FIG. 6F as an example. As shown in FIG. 8, the processing unit 810 is coupled to the first connective portions A, B, C, D1, D2~Dn and G1~Gn. The first connective portions A, B, C may be used as a clock generator of the demultiplexer 820. The first connective portion D1 is coupled to the source of the data lines Y0, Y1 and Y2, and the first connective portion D2 is coupled to the source of the data lines Y3, Y4 and Y5. In some embodiments, there are n first connective portions coupled to the source of the data lines, and this only illustrates the data lines corresponding to the first connective portions D1 and D2, for brevity. The first connective portions G1~Gn are coupled to the source (not shown) of the gate driver circuit. As shown in FIG. 8, the first connective portion A is coupled to the gate of the data lines Y0 and Y3, the first connective portion B is coupled to the gate of the data lines Y1 and Y4, and the first connective portion C is coupled to the gate of the data lines Y2 and Y5. In this embodiment, one first connective portion D1 may be used to control the switching of three data lines Y0, Y1 and Y2 by a signal combination of the clock generator (namely, the first connective portions A, B and C). Therefore, the number of required first connective portions is reduced.

In some embodiments, the processing unit is disposed on the back side of the substrate. In some embodiments, the processing unit on the back side of the substrate can be electrically connected to the display element layer on the front side, by using the first connective portion penetrating the substrate, and thus the signal is transmitted. Therefore, the processing unit does not occupy additional area on the front side of the substrate, and a display device that has a narrow border or is borderless is formed.

Figure 9:
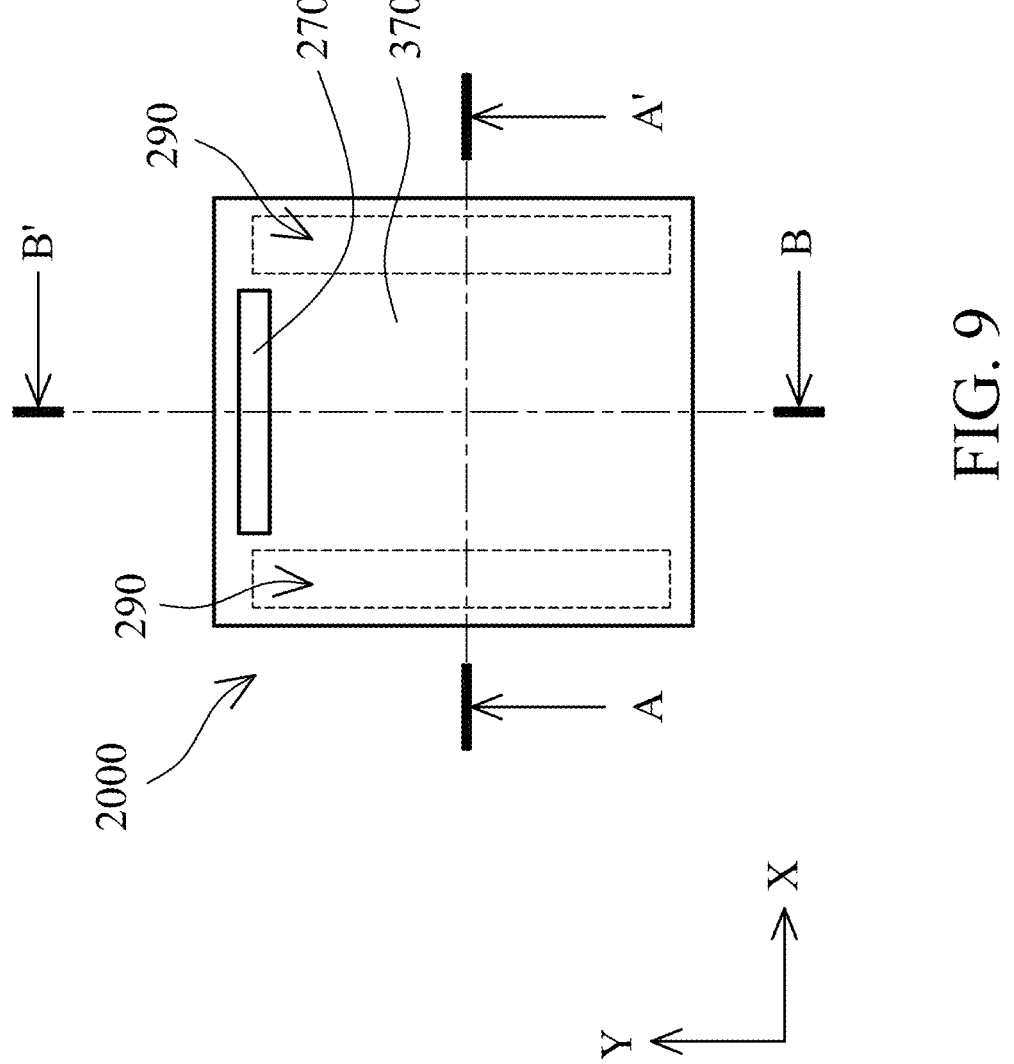
FIG. 9 is a top view of a display device, in accordance with some embodiments.

Referring to FIG. 9, FIG. 9 is a top view of a display device 2000, in accordance with some embodiments. It should be noted that FIG. 9 only illustrates a pixel driver circuit 370, a gate driver circuit 290 and a processing unit 270 of the display device 2000 for showing the arrangement of every element clearly. As shown in FIG. 9, the gate driver circuit 290 is disposed on two sides of the display device 2000, and extends along the first direction (Y direction). The processing unit 270 may be disposed on another side that is different from the sides on which the gate driver circuit 290 is disposed, and the processing unit 270 may be disposed between two gate driver circuits 290 and extend along the second direction (X direction). Although FIG. 9 illustrates two gate driver circuits, according to other embodiments, the display device 2000 can also include only one gate driver circuit.

Figures 10A, 10B:
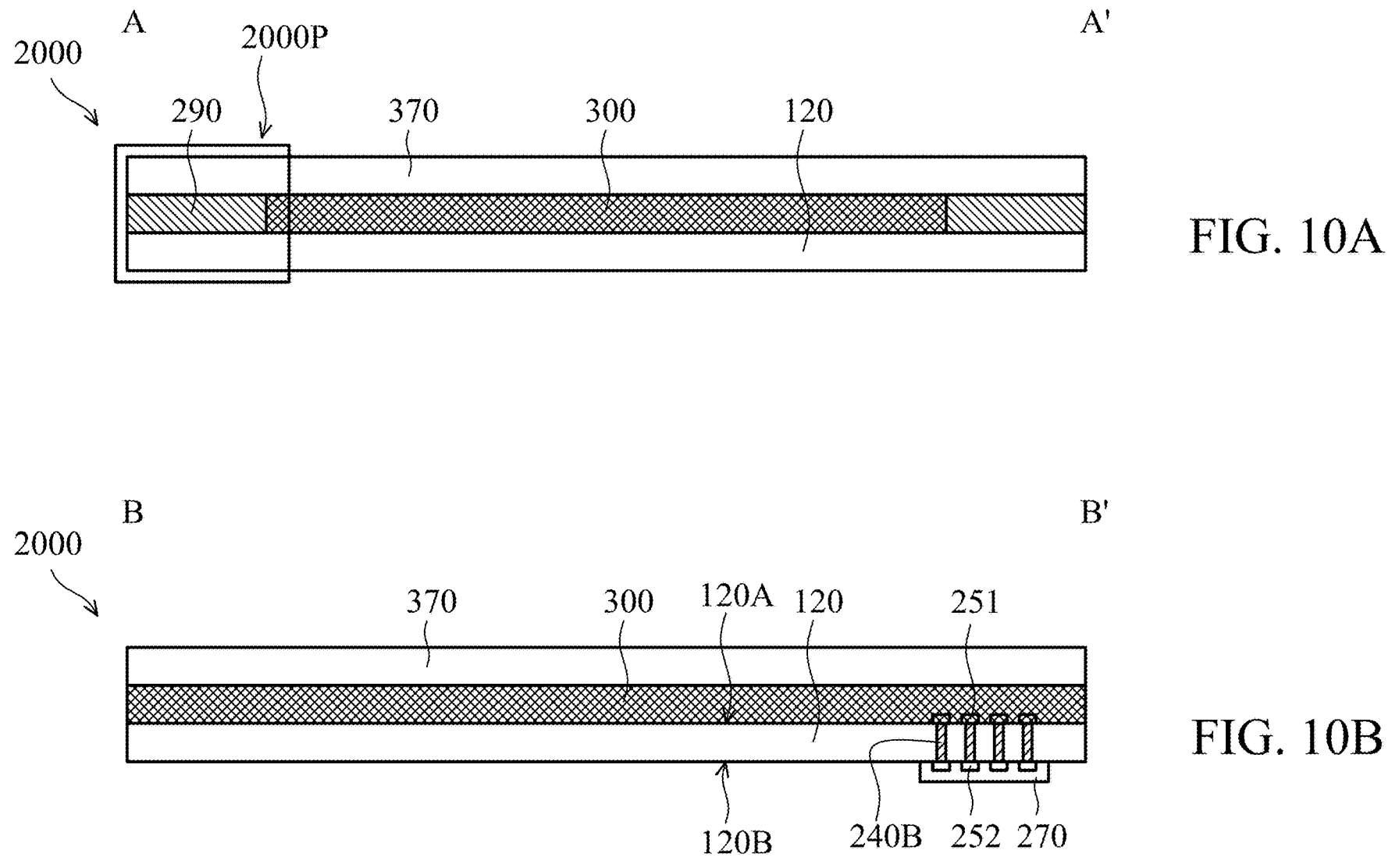

Referring to FIG. 10A, FIG. 10A is a cross-sectional view taken along line A-A' of the display device 2000 shown in FIG. 9, in accordance with some embodiments. As shown in FIG. 10A, the gate driver circuit 290 is disposed on the substrate 120, and on two sides of the substrate 120. In some embodiments, the pixel driver circuit 370 and the gate driver circuit 290 are in different layers. For example, the pixel driver circuit 370 and the gate driver circuit 290 may be disposed on the first surface 120A of the substrate 120, and the pixel driver circuit 370 is disposed on the gate driver circuit 290. In this embodiment, a space 300 among the pixel driver circuit 370, the substrate 120 and the gate driver circuit 290 may be used to dispose the circuits of other electronic elements therein. In some embodiments, the space 300 is used to dispose touch circuits or sensing circuits therein.

Referring to FIG. 10B, FIG. 10B is a cross-sectional view taken along line B-B' of the display device 2000 shown in FIG. 9, in accordance with some embodiments. As shown in FIG. 10B, the processing unit 270 is disposed on the second surface 120B of the substrate 120. In some embodiments, the processing unit 270 at least partially overlaps the first connective portion 240B. For example, the processing unit 270 is disposed directly under the first connective portion 240B, the first conductive layer 251 and the second conductive layer 252. In other embodiments, the processing unit 270 is not disposed directly under the first connective portion 240B. The processing unit 270 may be electrically connected to the first connective portion 240B through additional wires (not shown). For example, the processing unit can apply the connection as shown in FIG. 7A, and the processing unit 710 is electrically connected to the first connective portion 730 through the wires 720 as shown in FIG. 7A. Namely, in FIG. 10B, the processing unit 270 may be electrically connected to the first connective portion 240B through the wires (such as the wires 720, not shown) and the second conductive layer 252. In some embodiments, the processing unit 270, which is disposed on the second surface 120B of the substrate 120, may be electrically connected to the gate driver circuit 290, which is disposed on the first surface 120A of the substrate 120, through the first connective portion 240B. In some embodiments, the processing unit 270, which is disposed on the second surface 120B of the substrate 120, may be electrically connected to the touch circuits or the sensing circuits, which is disposed on the first surface 120A of the substrate 120, through the first connective portion 240B. In some embodiments, the touch circuits or the sensing circuits are disposed in the space 300.

In some embodiments, the gate driver circuit 290 at least partially overlaps the pixel circuit 370. With this arrangement, the gate driver circuit 290 does not occupy additional area on the substrate, and thereby a display device 2000 that has a narrow border or is borderless is formed. In some embodiments, the processing unit 270 is disposed on the second surface 120B of the substrate 120. Therefore, the processing unit 270 does not occupy additional area on the substrate, and thereby a display device 2000 that has a narrow border or is borderless is formed.

Figure 11A:
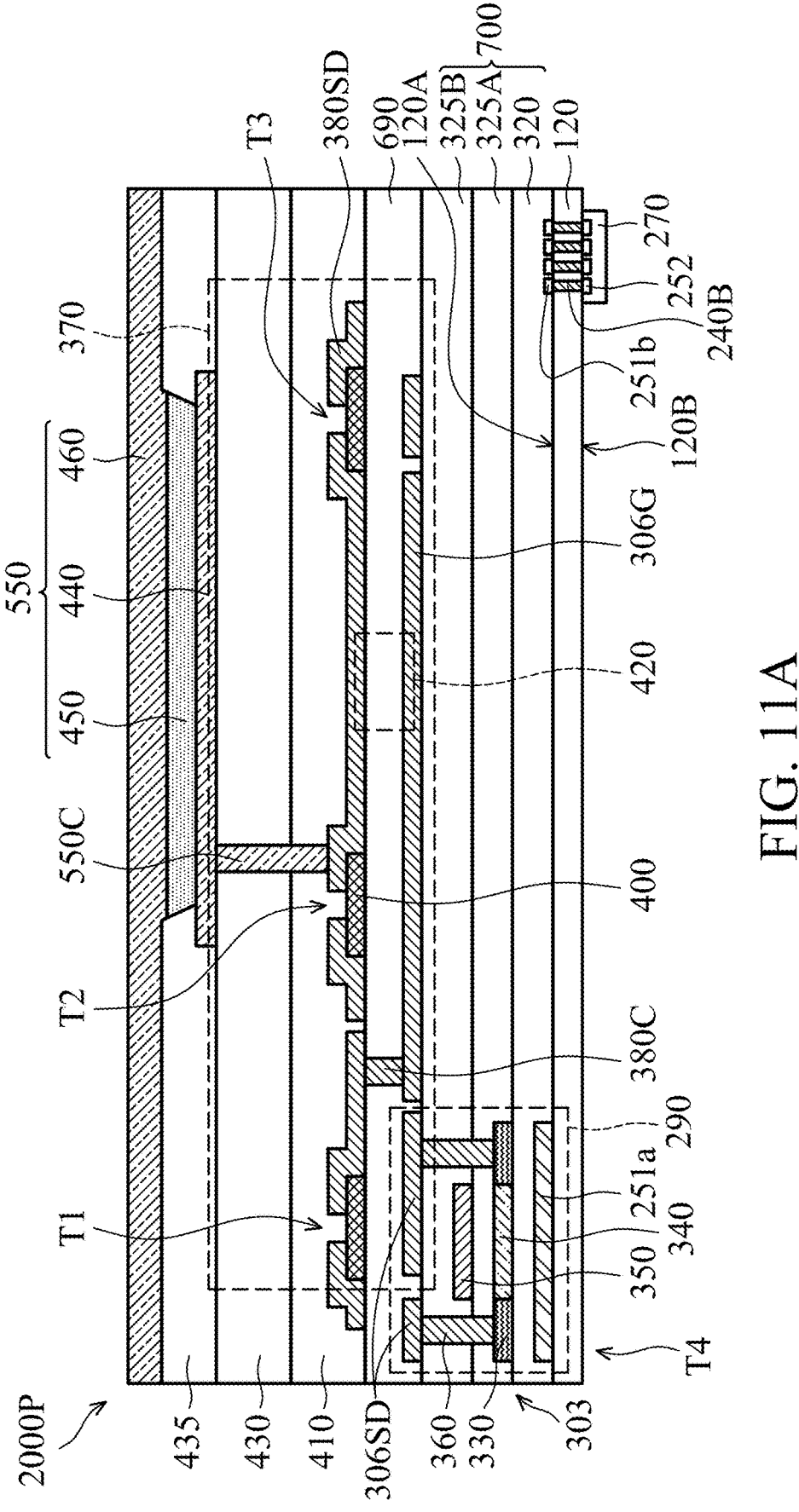
FIG. 11A is a partial cross-sectional view of a display device, in accordance with some embodiments.

Referring to FIG. 11A, FIG. 11A is a detailed circuit diagram of a part 2000P of the display device 2000 shown in FIG. 10A, in accordance with some embodiments. FIG. 11A only illustrates a part 2000P of the display device 2000, and the part 2000P includes a portion of the gate driver circuit 290, the pixel driver circuit 370 and a light-emitting element 550.

The gate driver circuit 290, the pixel driver circuit 370 and the light-emitting element 550 may be disposed on the first surface 120A of the substrate 120. The pixel driver circuit 370 may include, but is not limited to, thin film transistors T1, T2 and T3. The thin film transistor T1 may be a switch transistor, the thin film transistor T2 may be a driver transistor and the thin film transistor T3 may be a reset transistor. The gate driver circuit may include, but is not limited to, an output transistor T4. Although it only illustrates three thin film transistors of the pixel driver circuit 370 in FIG. 11A, those skilled in the art know that the pixel driver circuit may include more transistors to meet practical needs.

The first conductive layer 251 is disposed on the first surface 120A of the substrate 120 and the second conductive layer 252 is disposed on the second surface 120B of the substrate 120. The first conductive layer 251 may include a first part 251a and a second part 251b. The first part 251a may be disposed (directly) under the output transistor T4, and may be used to block a semiconductor layer 303 of the output transistor T4 from light. The second part 251b of the first conductive layer 251 may be disposed in a position corresponding to the first connective portion 240B, and electrically connected to the processing unit 270 through the first connective portion 240B. In some embodiments, the first part 251a and the second part 251b are formed in the same layer. In the present disclosure, the A layer and the B layer are the same layer, which means that the A layer and the B layer may be formed of the same material and patterned in the same process. Namely, the first part 251a and the second part 251b are formed of the same conductive material and are patterned in the same process.

In FIG. 11A, the processing unit 270 is disposed in the corresponding position to the first connective portion 240B. Namely, the processing unit 270 at least partially overlaps the first connective portion 240B. However, in other embodiments, the processing unit 270 does not overlap with the first connective portion 240B. For example, the processing unit 270 may be electrically connected to the first connective portion 240B through the wires (such as the wires 720 similar to FIG. 7A, not shown) and the second conductive layer 252 as shown in FIG. 7A.

An insulation layer 320 is disposed on the first conductive layer 251. The output transistor T4 is disposed on the insulation layer 320 and may include the semiconductor layer 303, a gate layer 350, and a source/drain layer 306SD. The semiconductor layer 303 is disposed on the insulation layer 320, an insulation layer 325A is disposed between the gate layer 350 and the semiconductor layer 303, and an insulation layer 325B is disposed between the gate layer 350 and the source/drain layer 306SD. The semiconductor layer 303 may include, but is not limited to, a channel region 340 and a doped region 330.

In some embodiments, the transistor of the gate driver circuit 290 and the transistor of the pixel driver circuit 370 may have the same layer. For example, as shown in FIG. 11A, the source/drain layer 306SD of the output transistor T4 and the gate 306G of the transistors T1, T2 and T3 of the pixel driver circuit 370 are in the same layer. Namely, the source/drain layer 306SD of the output transistor T4 and the gate 306G of the transistors T1, T2 and T3 are formed in the same conductive layer and patterned in the same process.

The transistor T4 is electrically connected to the switch transistor T1 so that the signal of the gate driver circuit 290 is transmitted to the switch transistor T1. The switch transistor T1 may be electrically connected to the driver transistor T2. FIG. 11A illustrates the transistor T4 of the gate driver circuit 290 as a top gate transistor, and the transistors T1, T2 and T3 of the pixel driver circuit 370 as bottom gate transistors. In other embodiments, the transistor T4 may also be a bottom gate transistor, and the transistors T1, T2 and T3 may also be top gate transistors. The active layer of the transistors T1, T2, T3 and T4 may be a semiconductor such as amorphous silicon, polysilicon or a metal oxide. The metal oxide may be indium gallium zinc oxide (IGZO). In some embodiments, the active layer 400 of the transistors T1, T2, T3 may be IGZO, and the active layer 303 of the transistors T4 may be polysilicon.

The light-emitting element 550 may be disposed on the pixel driver circuit 370. Insulation layers 410 and 430 may be disposed between the light-emitting element 550 and the pixel driver circuit 370. The light-emitting element 550 includes a first electrode 440, a light-emitting layer 450 and a second electrode 460. The light-emitting layer 450 is disposed between the first electrode 440 and the second electrode 460, and in an opening of the pixel definition layer 435. The second electrode 460 may cover the pixel definition layer 435. The first electrode 440 may be an anode, and the second electrode may be a cathode. Alternatively, the first electrode 440 may be a cathode, and the second electrode may be an anode. The first electrode 440 of the light-emitting element 550 may be electrically connected to the driver transistor T2 through a connective via 550C which may be formed in the insulation layers 410 and 430.

In some embodiments, the light-emitting layer 450 includes an organic light-emitting diode, and thereby the display device 2000 is used as an organic light-emitting diode display device. In some embodiments, the light-emitting layer 450 includes an inorganic light-emitting diode such as a micro light-emitting diode, and thereby the display device 2000 is used as a micro light-emitting diode display device.

Figure 11B:
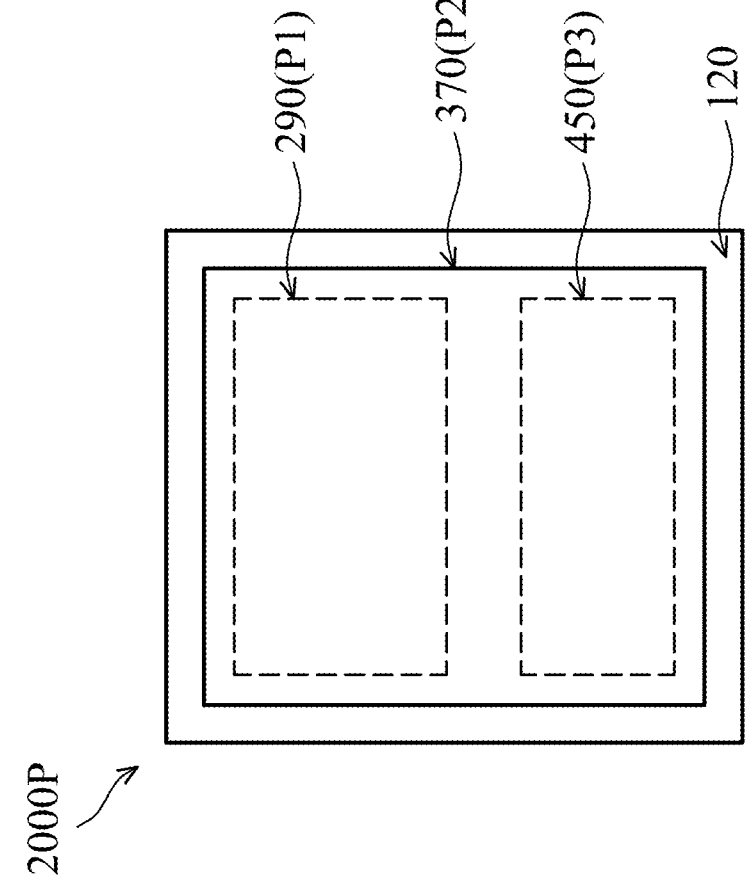
FIG. 11B is a partial top view of a display device shown in FIG. 11A, in accordance with some embodiments.

Referring to FIG. 11B, FIG. 11B is a part 2000P of the top view of a display device shown in FIG. 11A, in accordance with some embodiments. FIG. 11B illustrates the gate driver circuit 290, the pixel driver circuit 370, the light-emitting layer 450 and the substrate 120 with the quadrangles for showing the arrangement of the layout clearly. FIG. 11B only illustrates a part of the pixel driver circuit 370. The projection of the gate driver circuit 290 on the first surface 120A of the substrate 120 is referred to as a first projection P1, the projection of the pixel driver circuit 370 on the first surface 120A of the substrate 120 is referred to as a second projection P2, and the projection of the light-emitting layer 450 on the first surface 120A of the substrate 120 is referred to as a third projection P3. In some embodiments, in the part 2000P of the display device shown in FIG. 11B, the first projection P1 at least partially overlaps the second projection P2. In some embodiments, the third projection P3 at least partially overlaps the second projection P2, and the first projection P1 is separated from the third projection P3.

Figure 12:
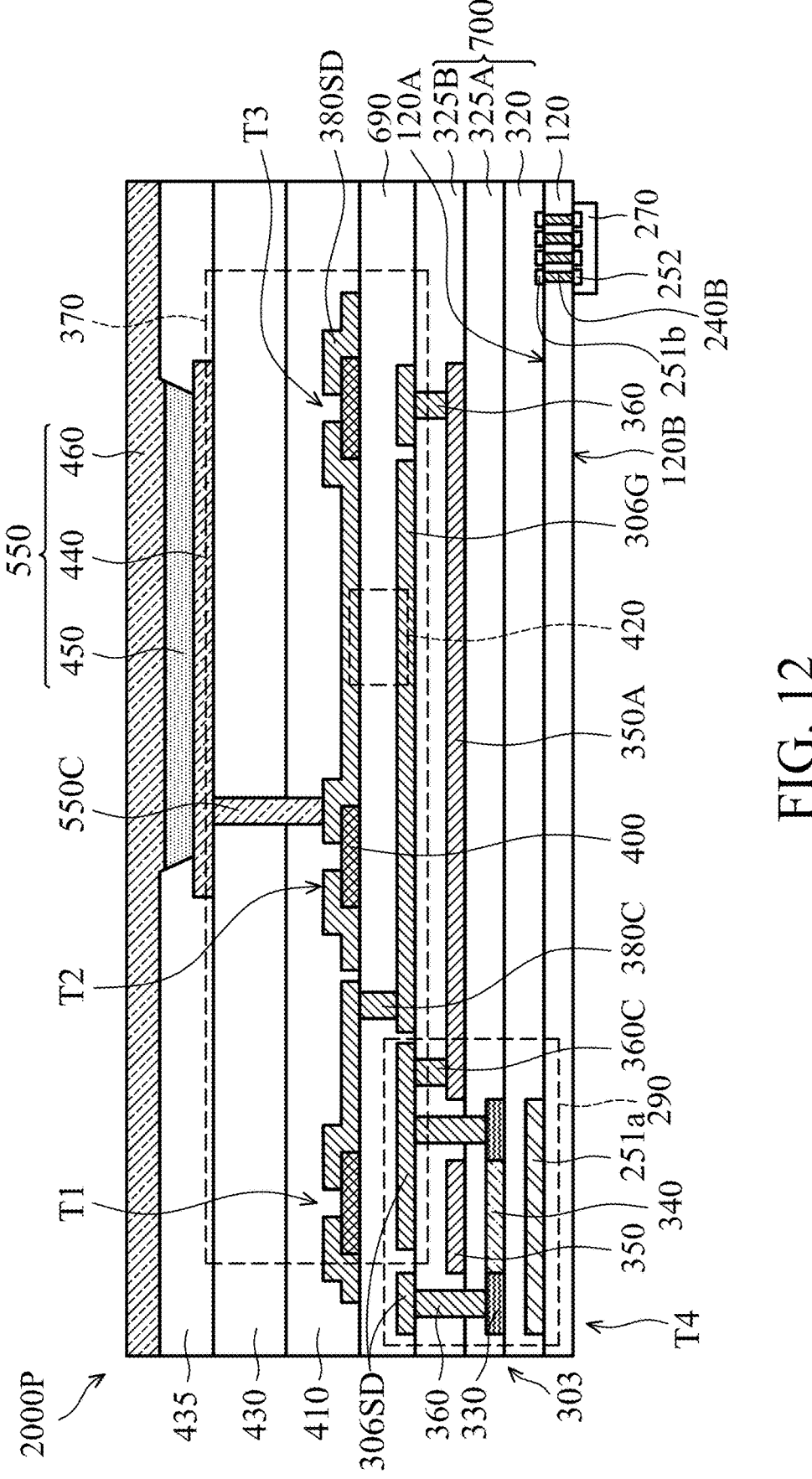
FIG. 12 is a partial cross-sectional view of a display device, in accordance with some embodiments.

Referring to FIG. 12, FIG. 12 is a detailed circuit diagram of the part 2000P of the display device shown in FIG. 10A, in accordance with other embodiments. FIG. 12 is a variation of FIG. 11A. One of the differences between FIG. 12 and FIG. 11A is that the display device further includes a conductive portion 350A formed between the insulation layer 325A and the insulation layer 325B. The gate driver circuit 290 may be electrically connected to the reset transistor T3 through the conductive portion 350A and a connective via 360C (formed in the insulation layer 325B). The conductive portion 350A and the gate layer 350 of the output transistor T4 may be in the same layer.

Figure 13:
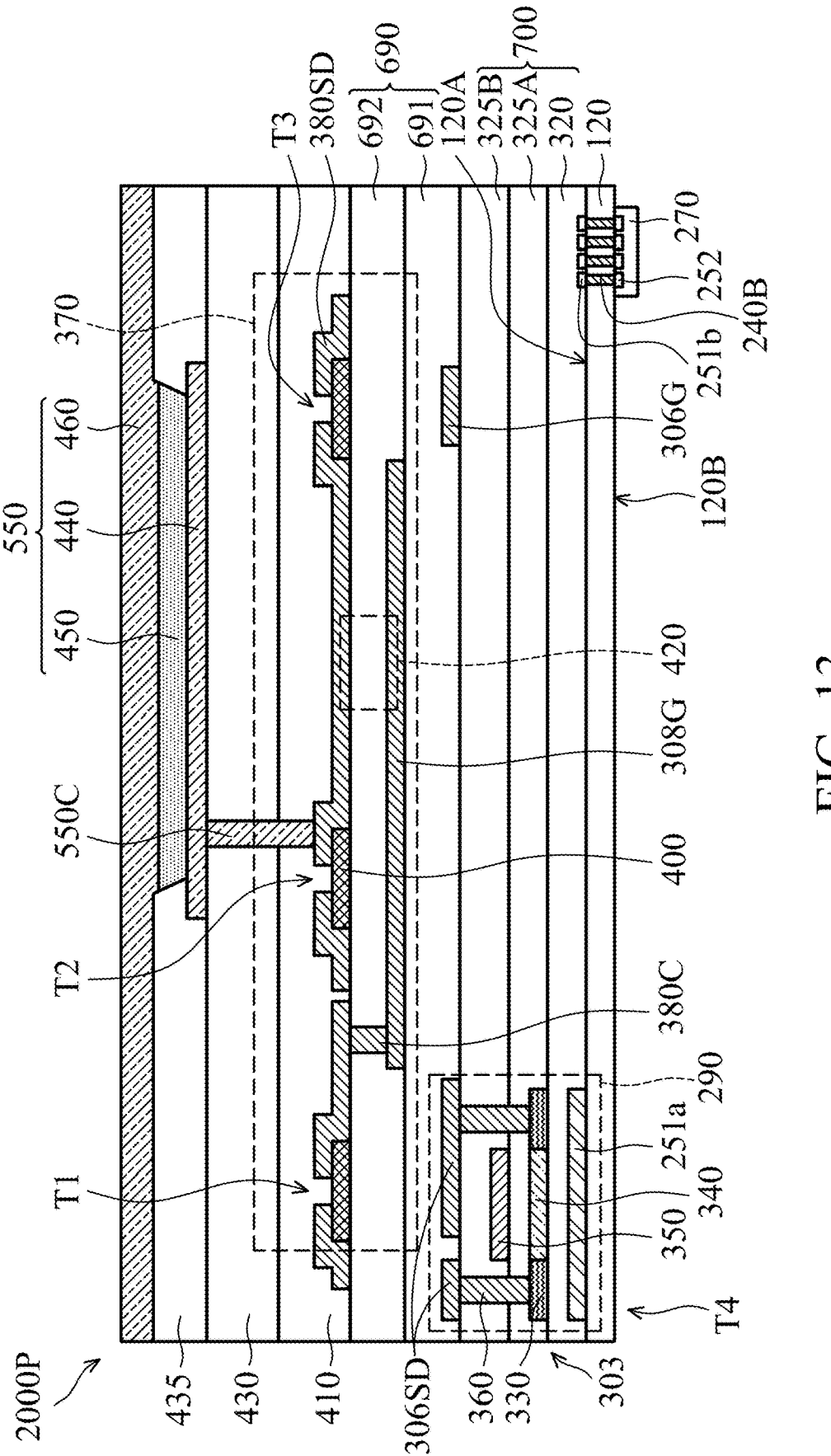
FIG. 13 is a partial cross-sectional view of a display device, in accordance with some embodiments.

Referring to FIG. 13, FIG. 13 is a detailed circuit diagram of the part 2000P of the display device 2000 shown in FIG. 10A, in accordance with other embodiments. FIG. 13 is a variation of FIG. 11A. One of the differences between FIG. 13 and FIG. 11A is that the gate 308G of the driver transistor T2 and the gate 306G of the reset transistor T3 are in different layers. The gate 308G is separated from the gate 306G by an insulation layer 691. An insulation layer 692 is disposed between the active layer 400 and the gate 308G. The gate 306G of the reset transistor T3 and the source/drain 306SD of the output transistor T4 may be the in same layer.

Figure 14A:
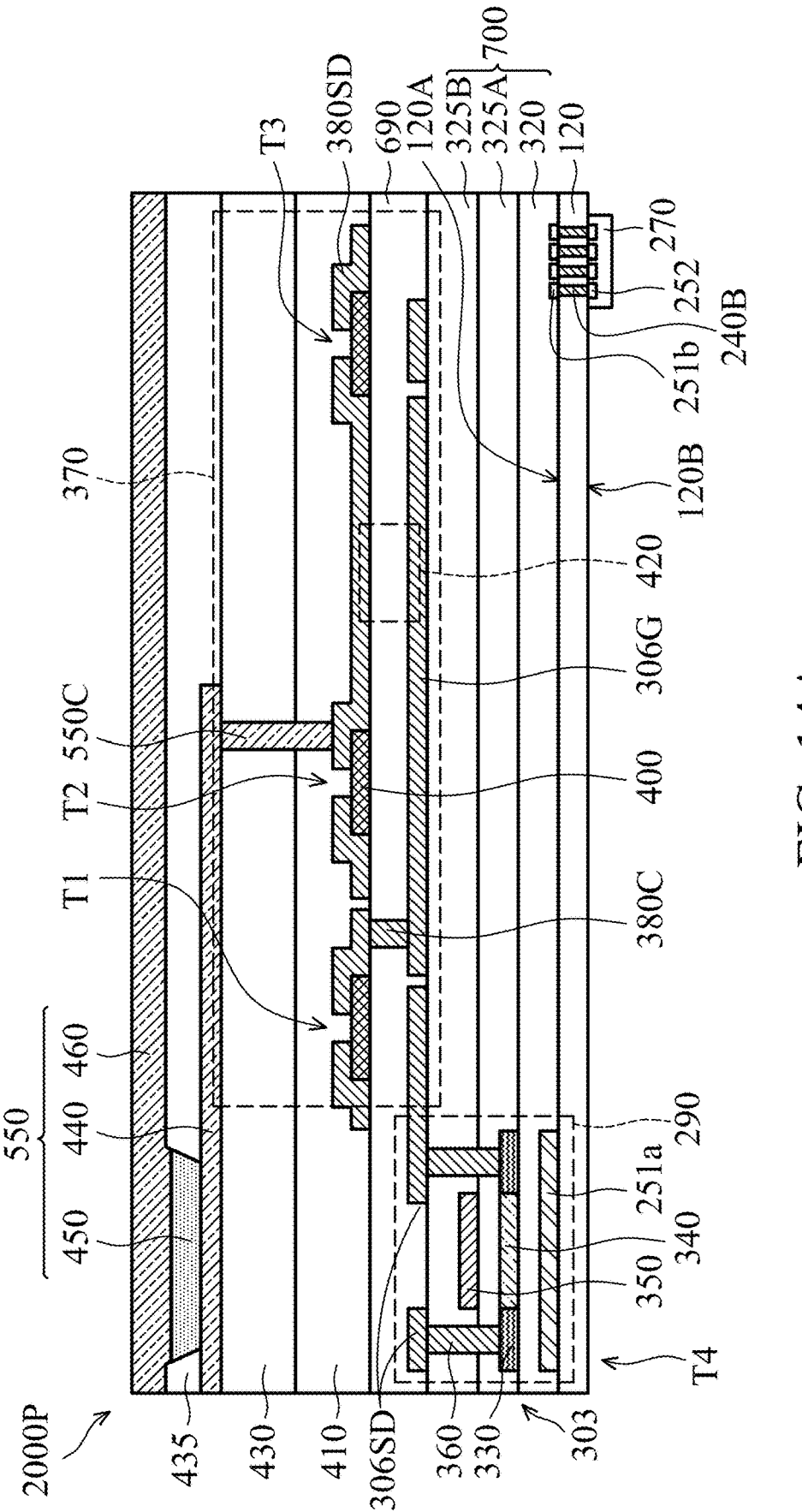
FIG. 14A is a partial cross-sectional view of a display device, in accordance with some embodiments.
Figure 14B:
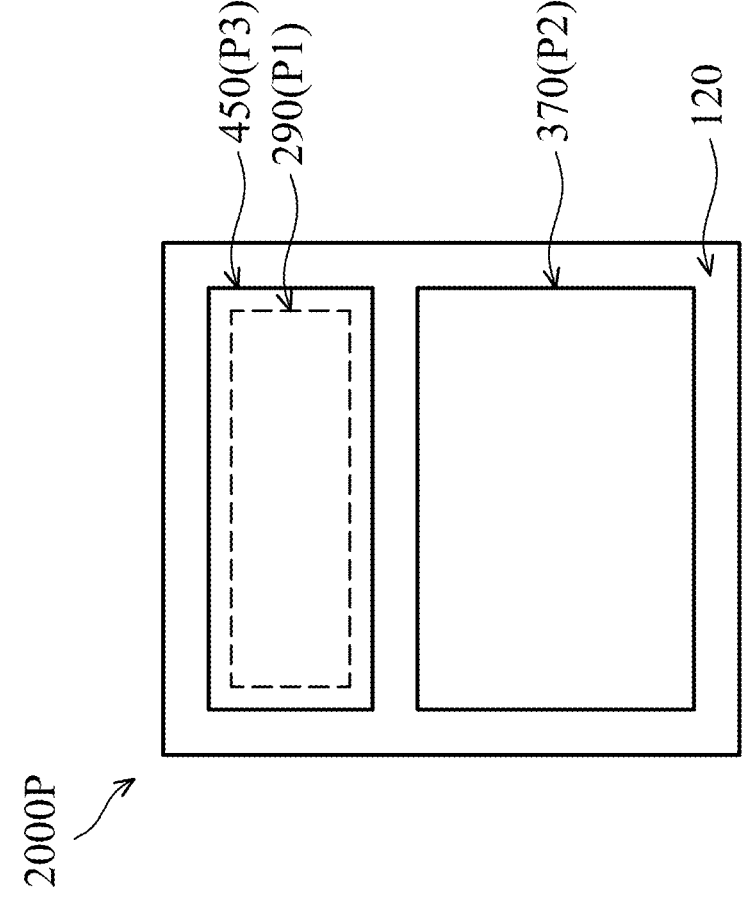
FIG. 14B is a partial top view of a display device shown in FIG. 14A, in accordance with some embodiments.

Referring to FIG. 14A, FIG. 14A is a detailed circuit diagram of the part 2000P of the display device 2000 shown in FIG. 10A, in accordance with other embodiments. FIG. 14A is a variation of FIG. 11A. One of the differences between FIG. 14A and FIG. 11A is that the position of the light-emitting layer 450 at least partially overlaps the gate driver circuit 290, and the position of the light-emitting layer 450 is separated from the pixel driver circuit 370. Namely, as shown in a top view of FIG. 14B, the third projection P3 at least partially overlaps the first projection P1, and the third projection P3 is separated from the second projection P2.

Figure 15A:
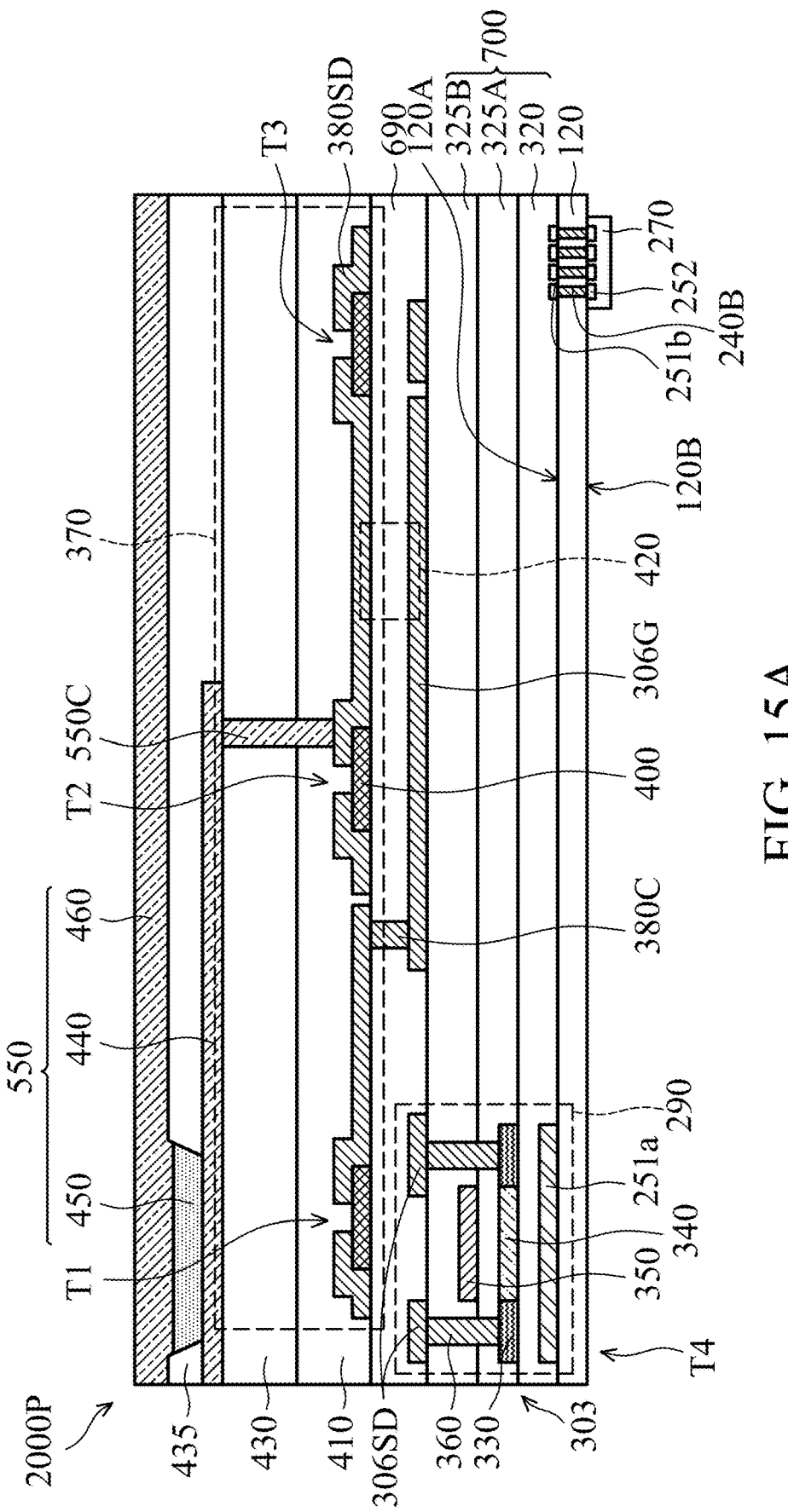
FIG. 15A is a partial cross-sectional view of a display device, in accordance with some embodiments.
Figure 15B:
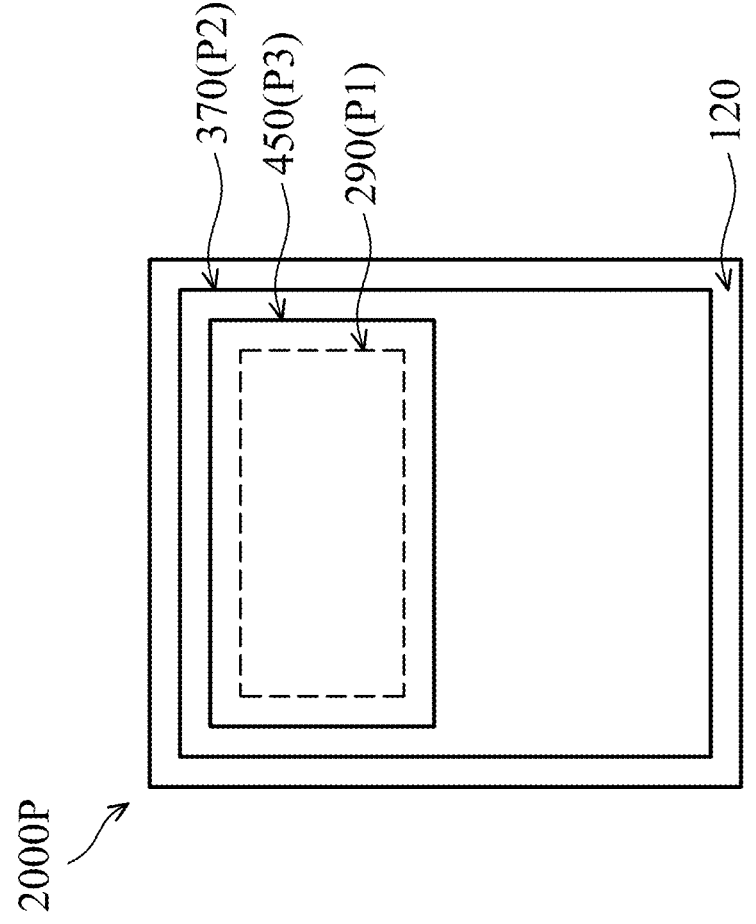
FIG. 15B is a partial top view of a display device shown in FIG. 15A, in accordance with some embodiments.

Referring to FIG. 15A, FIG. 15A is a detailed circuit diagram of the part 2000P of the display device 2000 shown in FIG. 10A, in accordance with other embodiments. FIG. 15A is a variation of FIG. 11A. One of the differences between FIG. 15A and FIG. 11A is that the pixel driver circuit 370, the gate driver circuit 290 and the light-emitting layer 450 are at least overlapping each other simultaneously. Namely, as shown in a top view of FIG. 15B, a portion of the first projection P1, a portion of the second projection P2 and a portion of the third projection P3 are at least overlapped to each other.

Figure 16:
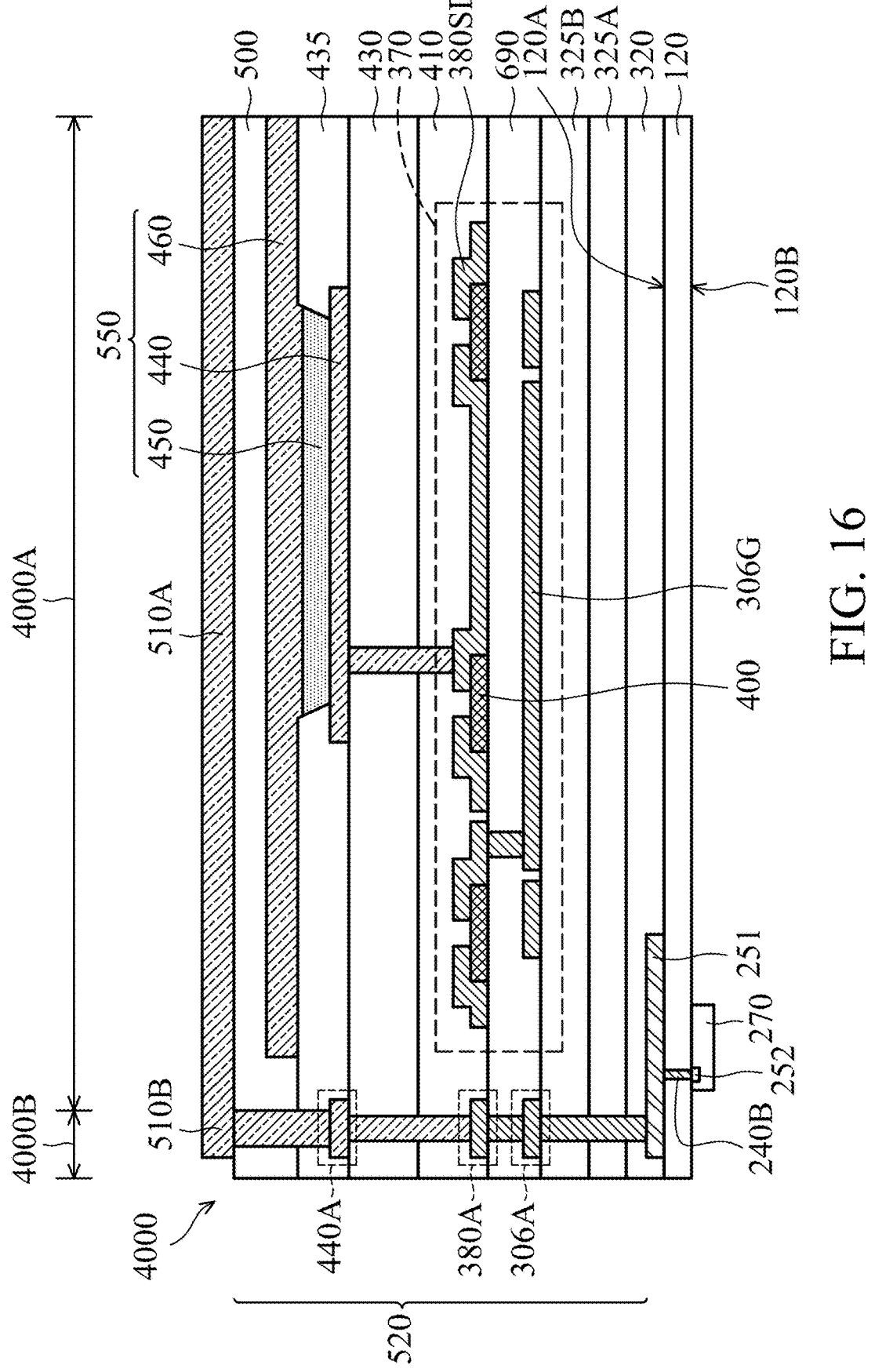
FIG. 16 is a cross-sectional view of a display device, in accordance with some embodiments.

FIG. 16 is a part of a cross-sectional view of a display device 4000, in accordance with some embodiments. The display device 4000 is a touch display device. FIG. 16 has elements that are similar to FIG. 11A. For example, the display device 4000 shown in FIG. 16 includes a pixel driver circuit 370, a light-emitting element 550, a processing unit 270, a first connective portion 240B, a first conductive layer 251, a second conductive layer 252, etc. The pixel driver circuit 370 may include, but is not limited to, the switch transistor T1, the driver transistor T2, and the reset transistor T3, and the description is omitted. As shown in FIG. 16, the display device 4000 further includes an encapsulation layer 500, a touch electrode 510A, a touch signal line 510B and a touch transmission portion 520. The touch electrode 510A is disposed in the touch region 4000A of the display device 4000. The touch signal line 510B and the touch transmission portion 520 are disposed in the peripheral region 4000B (non-touch region) of the display device 4000.

The encapsulation layer 500 is disposed on the light-emitting element 550, and the touch electrode 510A and the touch signal line 510B are disposed on the encapsulation layer 500. The encapsulation layer 500 may include a multiple layers structure, such as a structure that includes inorganic layer/organic layer/inorganic layer. The touch electrode 510A and the touch signal line 510B are disposed on the first surface 120A of the substrate 120. The touch electrode 510A is electrically connected to the first conductive layer 251 through the touch signal line 510B and the touch transmission portion 520. As a result, the signal from the processing unit 270 is transmitted to the touch signal line 510B through the first connective portion 240B and the touch transmission portion 520.

The material of the touch electrode 510A may be the same as or different from that of the touch signal line 510B. The material of the touch electrode 510A and the touch signal line 510B may include, but is not limited to, indium tin oxide (ITO), tin oxide (SnO), indium zinc oxide (IZO), indium gallium zinc oxide (IGZO), indium tin zinc oxide (ITZO), antimony tin oxide (ATO), antimony zinc oxide (AZO), metal, or a combination thereof.

The touch transmission portion 520 may include a first touch transmission 306A, a second touch transmission 380A and a third touch transmission 440A. In some embodiments, for simplifying the process, the first touch transmission 306A, the second touch transmission 380A and the third touch transmission 440A may be the same layer as the electrode layer of the transistor of the pixel driver circuit 370, or the same layer as the electrode layer of the light-emitting layer 550. For example, as shown in FIG. 16, the first transmission portion 306A may be the same layer as the gate 306G of the transistors (T1, T2 or T3) of the pixel driver circuit 370, and the second transmission portion 380A may be the same layer as the source/drain 380SD of the transistors (T1, T2 or T3). The third transmission portion 440A may be the same layer as the first electrode 440 of the light-emitting element 550. The touch electrode 510A is electrically connected to the first conductive layer 251 through the touch signal line 510B and the touch transmission portion 520.

Figure 17:
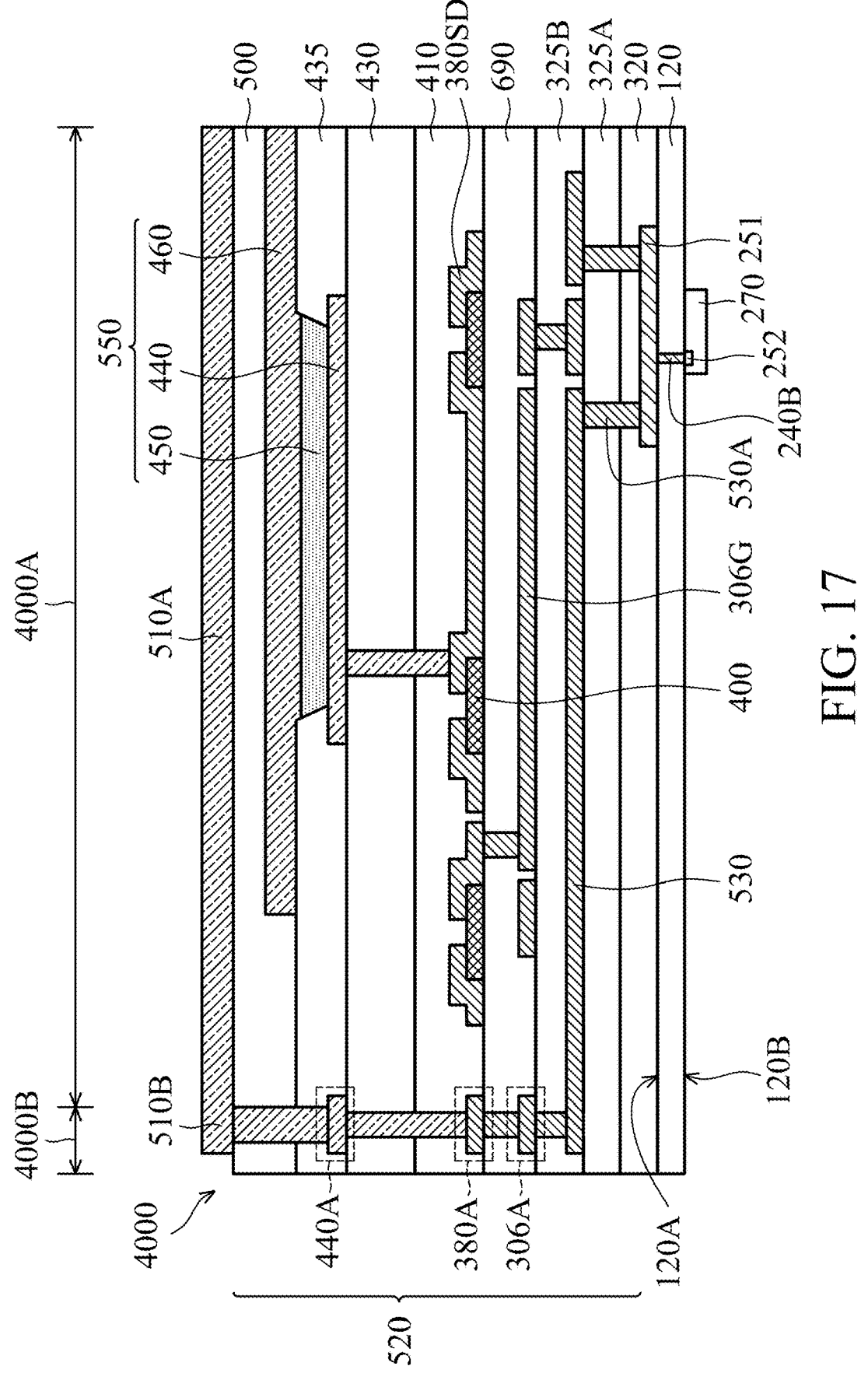
FIG. 17 is a cross-sectional view of a display device, in accordance with some embodiments.

Referring to FIG. 17, FIG. 17 is a cross-sectional view of a display device 4000, in accordance with some embodiments. FIG. 17 is a variation of FIG. 16. One of the differences between FIG. 17 and FIG. 16 is that the display device 4000 further includes a touch signal line 530 and a connective portion 530A. The touch signal line 530 may be disposed between the insulation layer 325A and the insulation layer 325B, and the connective portion 530A may penetrate through the insulation layer 325A and the insulation layer 320. The touch electrode 510A is electrically connected to the first conductive layer 251 through the touch signal line 510B, the touch transmission portion 520, the touch signal line 530 and the connective portion 530A.

Figure 18:
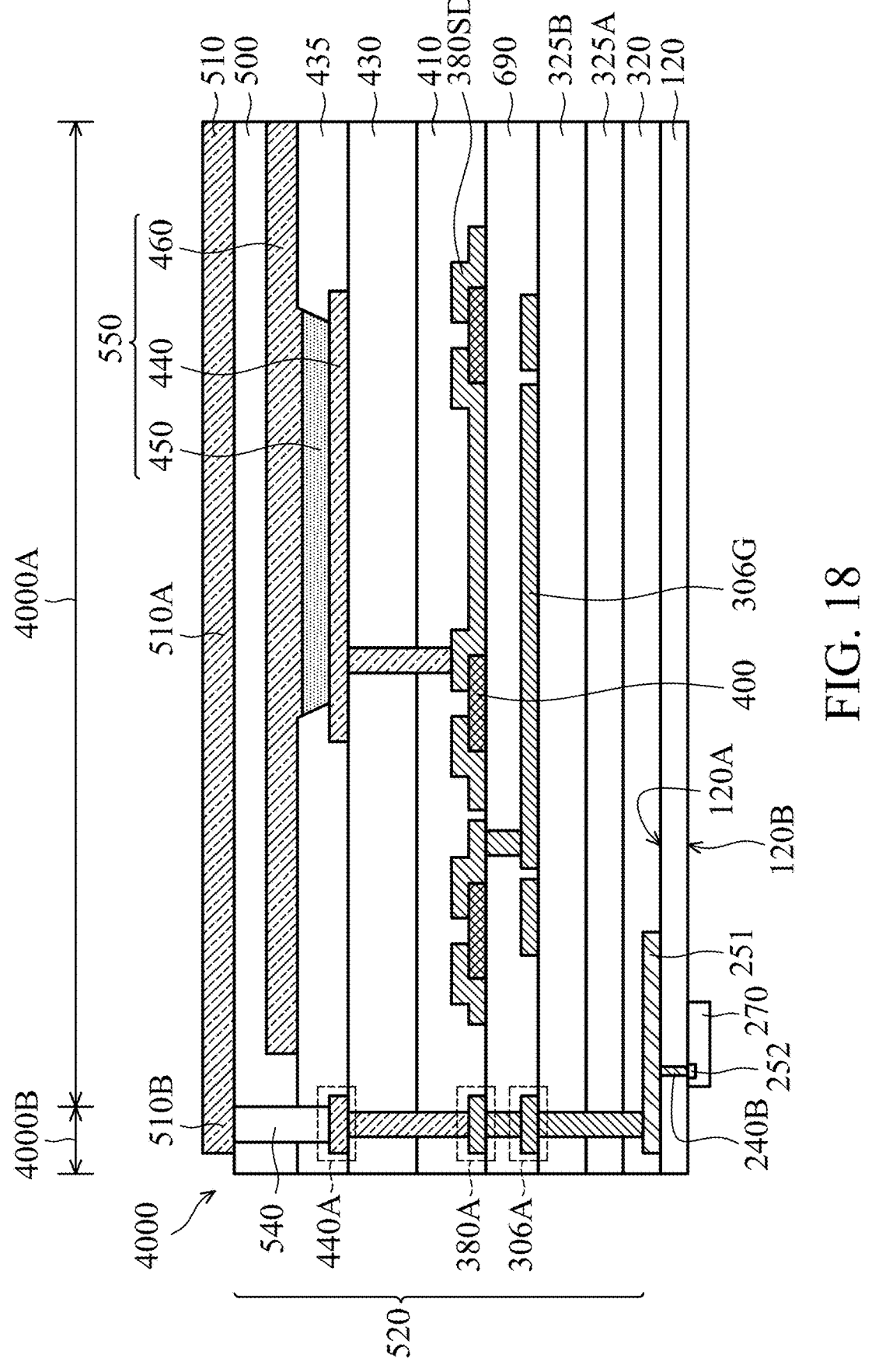
FIG. 18 is a cross-sectional view of a display device, in accordance with some embodiments.

Referring to FIG. 18, FIG. 18 is a cross-sectional view of a display device 4000, in accordance with some embodiments. FIG. 18 is a variation of FIG. 16. One of the differences between FIG. 18 and FIG. 16 is that the display device 4000 shown in FIG. 18 further includes a conductive ink 540 disposed between the touch signal line 510B and the third transmission portion 440A. The conductive ink 540 may penetrate through the encapsulation layer 500 and a portion of the pixel definition layer 435.

Figure 19A:
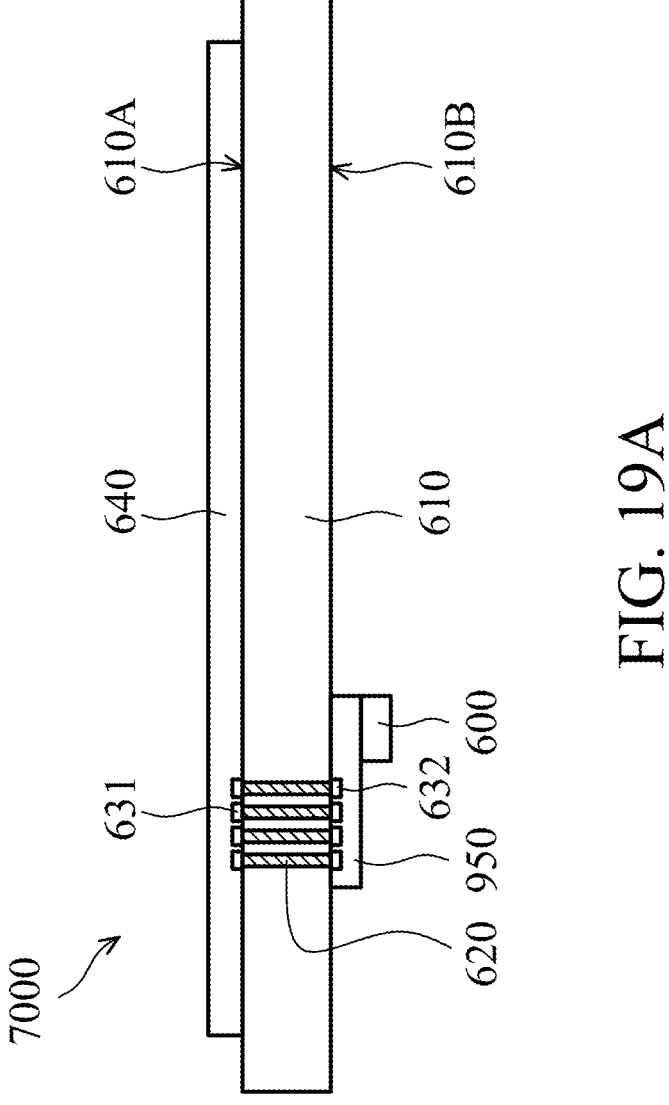
FIG. 19A is a cross-sectional view of a display device, in accordance with some embodiments.

Referring to FIG. 19A, FIG. 19A is a cross-sectional view of a display device 7000, in accordance with some embodiments. The display device 7000 is similar to the display device 5000 described above, except that the display device 7000 further includes a printed circuit board assembly (PCBA) 95width0. The printed circuit board assembly is disposed on the second surface 610B of the substrate 610 and electrically connected to the second conductive layer 632. The processing unit 600 is disposed on and electrically connected to the printed circuit board assembly 950. The first connective portion 620 is at least partially disposed in the substrate 610, and penetrates from the first surface 610A to the second surface 610B. The same elements described in FIG. 6A are not repeated here for brevity. As shown in FIG. 19A, the printed circuit board assembly 950 is disposed on the second surface 610B of the substrate 610. The printed circuit board assembly 950 may include solders, conductive pads, conductive wires and other conductive elements mounted on a substrate. The printed circuit board assembly 950 can be a flexible printed circuit board assembly (FPCBA), and the substrate can be a flexible substrate, such as polyimide or other polymer materials.

As shown in FIG. 19A, the processing unit 600 is disposed on the printed circuit board assembly 950, and is electrically connected to the first connective portion 620 through the printed circuit board assembly 950. In some embodiments, the position of the processing unit 600 can be in a position not overlapping the first connective portion 620, in a direction perpendicular to the first surface 610A, as shown in FIG. 19. For example, as shown in FIG. 19E, the processing unit 600 can be in a position overlapping the second connective portion 651. The second connective portion 651 is disposed in the first insulation layer 700 and the second insulation layer 690, and penetrates through the first insulation layer 700 and the second insulation layer 690. Alternatively, in other embodiments, the position of the processing unit 600 can at least partially overlap the first connective portion 620, not shown in figures.

In some embodiments, the processing unit 600 and the flexible printed circuit board assembly 950 can form a chip-on-film (COF) structure. In some embodiments, only a portion of the flexible printed circuit board assembly 950 can be fixed on the second surface 610B of the substrate 610, and the other portion of the flexible printed circuit board assembly 950 can be not fixed on the substrate 610. Namely, a portion of the flexible printed circuit board assembly 950 can be not in direct contact with the substrate 610.

Figure 19B:
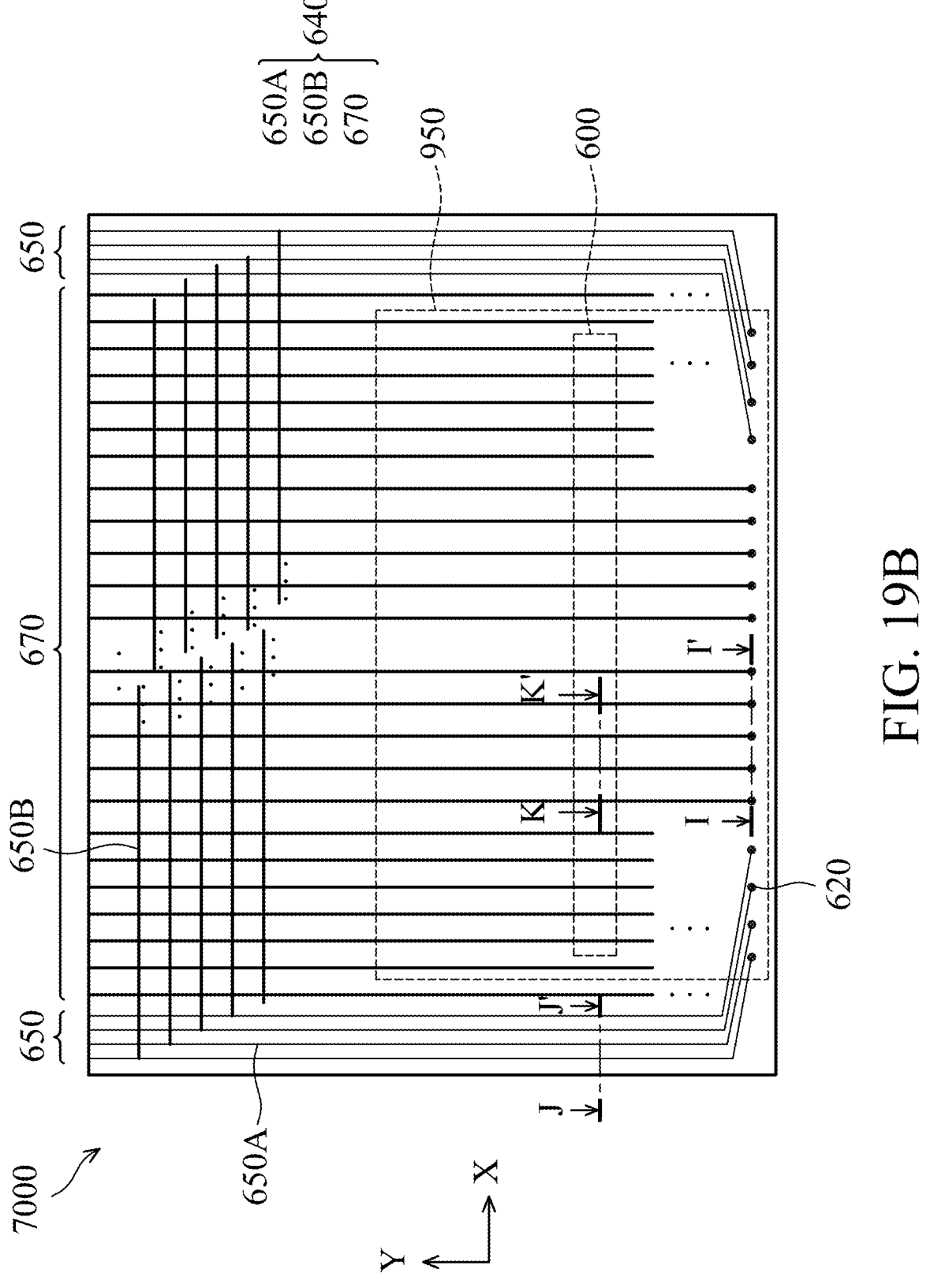
FIG. 19B is a top view of a circuit layout of a display device shown in FIG. 6A, in accordance with some embodiments.

Referring to FIG. 19B, FIG. 19B is a top view of a circuit layout of the display device 7000 shown in FIG. 19A, in accordance with some embodiments. It should be noted that FIG. 19B only illustrates the processing unit 600, the first connective portion 620, the printed circuit board assembly 950 and other circuits disposed in the display element layer 640 for brevity. The same elements described in FIG. 6B are not repeated here for brevity. In some embodiments, as shown in FIGS. 19A and 19B, the printed circuit board assembly 950 is electrically connected to the display signal line 650A of the gate driver circuit 650 through the multiple first connective portions 620 and the first conductive layer 631.

Referring to FIGS. 19C-19E, FIG. 19C is a cross-sectional view taken along line I-I', FIG. 19D is a cross-sectional view taken along line J-J', and FIG. 19E is a cross-sectional view taken along line K-K' of the display device 7000 shown in FIG. 19B, in accordance with some embodiments. The same elements described in FIGS. 6C-6E are not repeated here for brevity. As shown in FIG. 19C, the printed circuit board assembly 950 is disposed on the second surface 610B of the substrate 610. The printed circuit board assembly 950 is physically and electrically connected to the second conductive layer 632, and electrically connected to the first conductive layer 631 through the second conductive layer 632 and the first connective portion 620. As shown in FIGS. 19C and 19D, the printed circuit board assembly 950 is electrically connected to the display signal line 650A through the first conductive layer 631 and the second connective portion 651. In some embodiments, as shown in FIG. 19E, the data line 670 is electrically connected to the first conductive layer 631 through the second connective portion 651.

Figure 20:
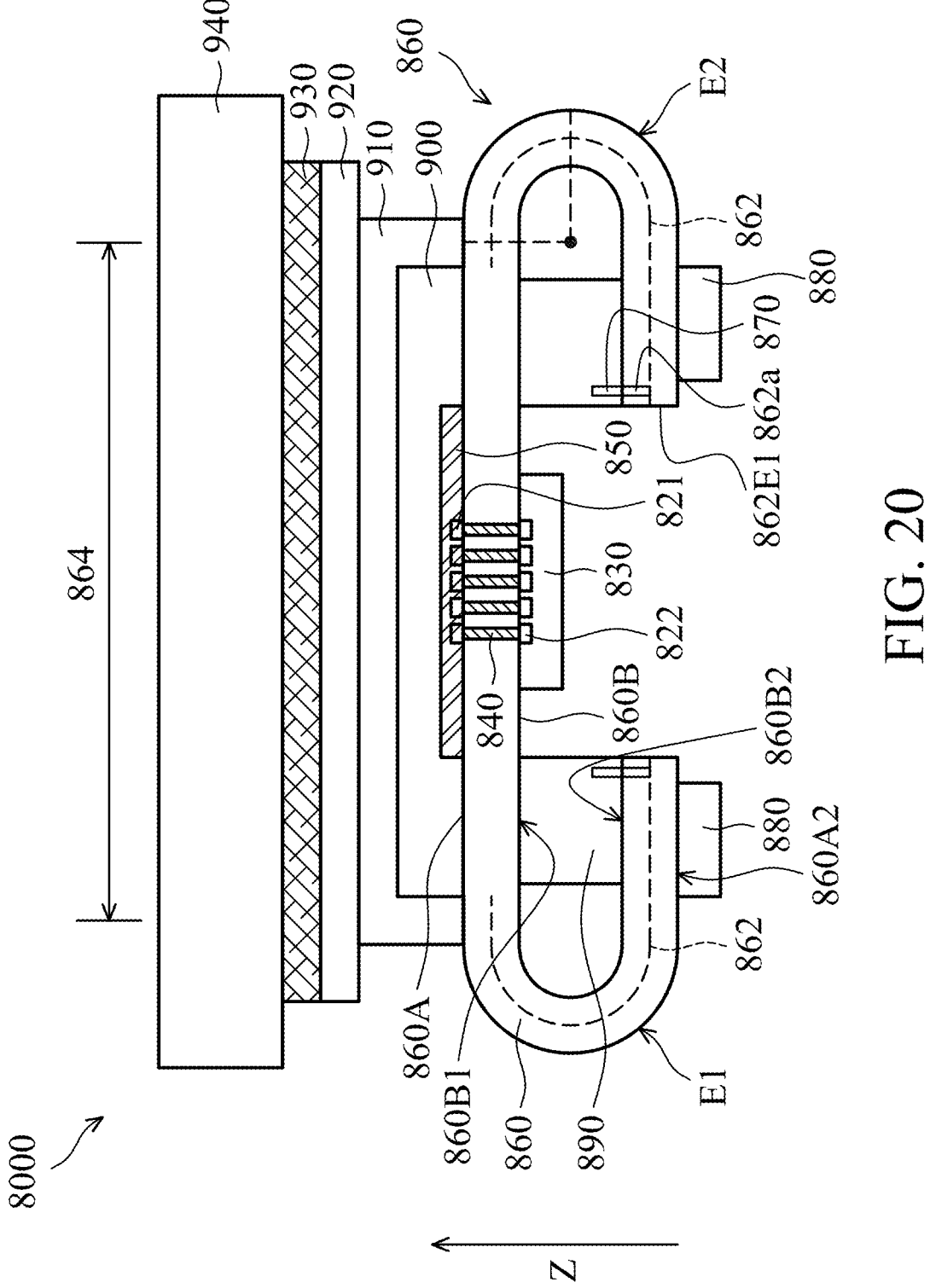
FIG. 20 is a cross-sectional view of a display device, in accordance with some embodiments.

Referring to FIG. 20, FIG. 20 is a cross-sectional view of a display device 8000, in accordance with some embodiments. In some embodiments, the display device 8000 includes a cap layer 940, a polarizing film 930, a touch sensing layer 920, an encapsulation layer 910, a light-emitting element 900, a substrate 860 and a processing unit 830. Many variations and/or modifications can be made to embodiments of the disclosure. In some other embodiments, the polarizing film 930 and the touch sensing layer 920 can be omitted and be not formed.

As shown in FIG. 20, the substrate 860 has a first surface 860A and a second surface 860B opposite to the first surface 860A. A first conductive layer 821 is formed on the first surface 860A, and a second conductive layer 822 is formed on the second surface 860B. A first connective portion 840 is at least partially disposed in the substrate 860, and penetrates from the first surface 860A to the second surface 860B. The first conductive layer 821 is electrically connected to the second conductive layer 822 by the first connective portion 840.

In some embodiments, a demultiplexer 850 is disposed on the first surface 860A, and the processing unit 830 is disposed on the second surface 860B. The processing unit 830 is electrically connected to the demultiplexer 850 through the first connective portion 840. As shown in FIG. 20, the light-emitting element 900 and the encapsulation layer 910 are disposed on the first surface 860A of the substrate 860, and the light-emitting element 900 can be encapsulated by the encapsulation layer 910. In some embodiments, the light-emitting element 900 includes, but is not limited to, an organic light-emitting diode, a micro light-emitting diode, a quantum dot light-emitting diode, or other suitable light-emitting diode.

As shown in FIG. 20, the touch sensing layer 920 is disposed on the encapsulation layer 910. The touch sensing layer 920 is only shown as a single layer for brevity. However, it should be noted that the touch sensing layer 920 can be a single layer, two layers, or more than two layers. For example, the touch sensing layer 920 can include a plurality of first electrodes (not shown) and a plurality of second electrodes (not shown), and the first electrodes and the second electrodes can be arranged along different directions. The first electrodes can be driving electrodes, and the second electrodes can be sensing electrodes, and vice versa. In other embodiments, the touch sensing layer 920 can include first touch electrodes that are disposed on the encapsulation layer 910, and second touch electrodes (not shown) can be disposed under the encapsulation layer 910 and integrated in the light-emitting element 900.

As shown in FIG. 20, the cap layer 940 is disposed over the polarizing film 930. The cap layer 940 may be used as a protective structure for the display device 8000. The cap layer 940 may include, but is not limited to, a glass substrate, a ceramic substrate, a plastic substrate or another applicable substrate.

In some embodiments, as shown in FIG. 20, at least one edge portion of the substrate 860 can be bent. For example, as shown in FIG. 20, the substrate 860 has a first edge portion E1 and a second edge portion E2 opposite to the edge portion E1. In some embodiments, the first edge portion E1 and the second edge portion E2 are bent downward. The portion of the substrate 860, which has been bent, for example, bent downward, is defined as a bent portion 862. In this embodiment, the first edge portion E1 includes one bent portion 862, and the second edge portion E2 includes one bent portion 862. The portion of the substrate 860, which has not been bent, is defined as a main portion 864. In some embodiments, the main portion 864 can be flat, as shown in FIG. 20. However, in other embodiments, the main portion 864 can be not flat and include an uneven or curved surface. In such a situation, the bent portion 862 can be bent to a greater bending extent than the main portion 864.

In addition, although not shown in FIG. 20 for simplicity, the light-emitting element 900, the encapsulation layer 910, the touch sensing layer 920, the polarizing film 930, and the cap layer 940 can also be bent. That is, for example, in the first edge portion E1 and/or in the second edge portion E2, one of or more of the light-emitting element 900, the encapsulation layer 910, the touch sensing layer 920, the polarizing film 930, and the cap layer 940 can be bent conformally to the profile of the bent portion 862 of the substrate 860. In some embodiments, in the first edge portion E1 and/or in the second edge portion E2, all of the light-emitting element 900, the encapsulation layer 910, the touch sensing layer 920, the polarizing film 930, and the cap layer 940 can be bent conformally to the profile of the bent portion 862 of the substrate 860.

In some embodiments, the display device 8000 further includes a supporting member 890. In some embodiment, the supporting member 890 can be disposed between the main portion 864 and the bent portion 862 along a third direction (Z direction) for supporting the bent portion 862 and also preventing the bent portion 862 from over bent. The third direction is a thickness direction and is a direction perpendicular to the first surface 860A of the main portion 864. Specifically, as shown in FIG. 20, in the bent portion 862, the second surface 860B of the substrate 860 is bent downwardly. Thus, the second surface 860B 1 in the main portion 864 can face to the second surface 860B2 in the bent portion 862. In other words, the supporting member 890 is disposed between the second surface 860B1 in the main portion 864 and the second surface 860B2 in the bent portion 862. The supporting member 890 can be made of metal or plastic, but is not limited thereto. The supporting member 890 can be in any shape, such as a strip shape, or can include a concave structure.

If the radius of curvature of the bent portion 862 of the substrate 860 exceeds an allowable radius of curvature or there is excessive bending stress, cracks may occur in the bent portion 862 or in an area adjacent to the bent portion 862, thereby causing deterioration in the display quality of the display device 8000. However, disposing the supporting member 890 may prevent such cracks from occurring. Furthermore, the curvature at which the substrate 860 can be bent may be restrained by the thickness of the supporting member 890. For example, with a thicker supporting member 890, the bent portion 862 is bent loosely in a smaller curvature (larger radius of curvature). On the other hand, with a thinner supporting member 890, the bent portion 862 may be bent in a larger curvature (smaller radius of curvature) or even bent in circular arc.

Furthermore, the supporting member 890 can include a first alignment mark 870 near an edge surface 862E1 of the bent portion 862. Thus, the edge surface 862E1 can be aligned with the first alignment mark 870. In some embodiments, the first alignment mark 870 can be formed on the supporting member 890 with scale marks. By means of aligning with different scale marks, the edge surface 862E1 of the bent portion 862 can be aligned to different predetermined positions or with different curvatures according requirement. Thus, the bending extent of the bent portion 862 can be adjusted. In other embodiments, the supporting member 890 may have multiple first alignment marks 870 according to the design requirements.

Furthermore, in some embodiments, the bent portion 862 can include a second alignment mark 862a. During the bending process, the second alignment mark 862a and the first alignment mark 870 can be aligned with each other. With design of the positions of the first alignment mark 870 and the second alignment mark 862a, the bending extent of the bent portion 862 can be adjusted. In other embodiments, the bent portion 862 may have multiple second alignment marks 862a according to the design requirements.

In some embodiments, as shown in FIG. 20, the gate driver circuit 880 can be disposed on the first surface 860A2 of the bent portion 862. Thus, the gate driver circuit 880 can overlap the main portion 864. Specifically, the gate driver circuit 880 can overlap the light-emitting element 900 on the main portion 864 along the third direction (Z direction). The electrical connection relationship of the gate driver circuit 880 is similar to the gate driver circuit 650 in the above embodiment shown in FIG. 6F, and detailed descriptions are omitted for brevity.

Figure 21:
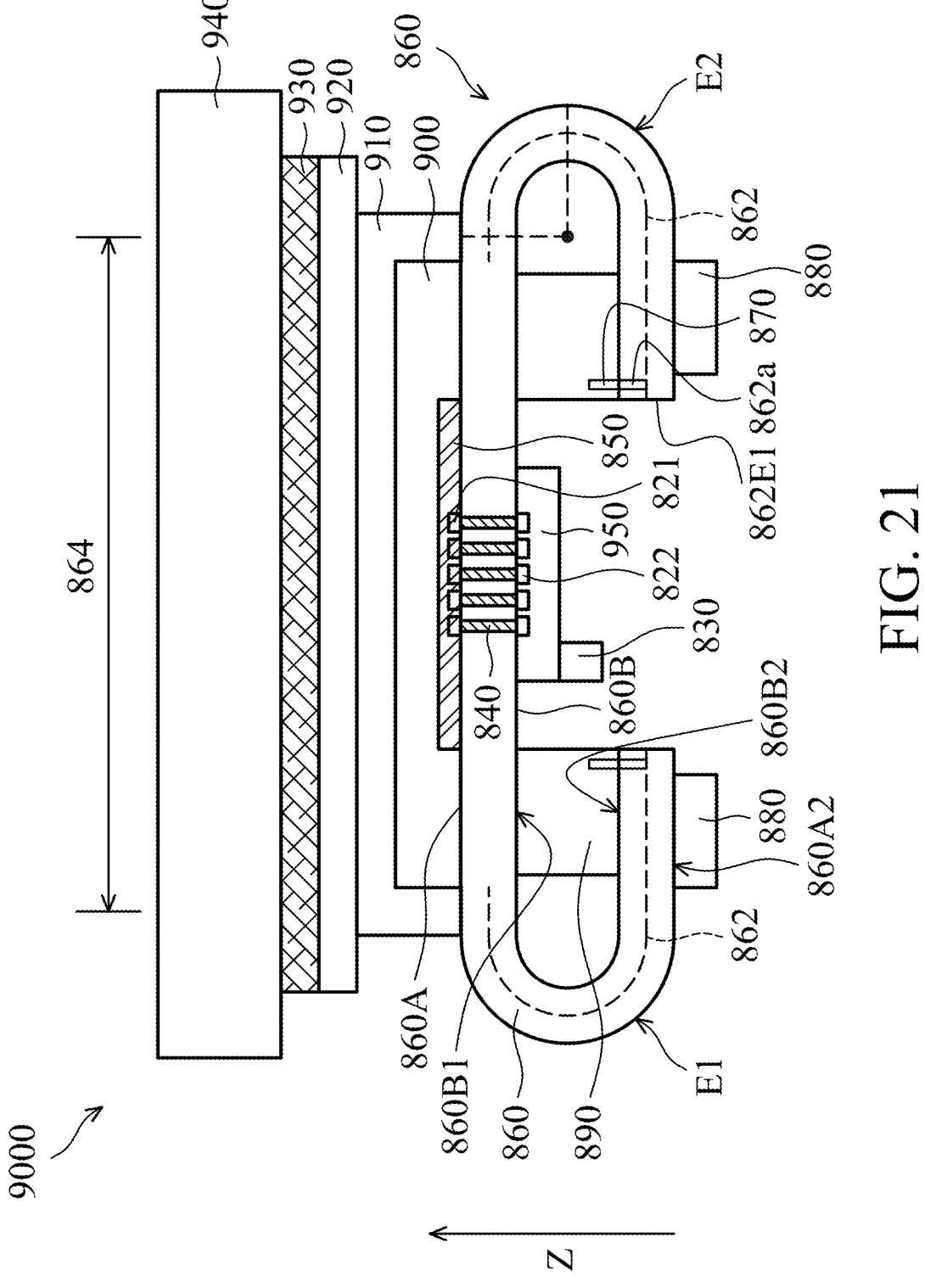
FIG. 21 is a cross-sectional view of a display device, in accordance with some embodiments.

Referring to FIG. 21, FIG. 21 is a cross-sectional view of a display device 9000, in accordance with some embodiments. The display device 9000 in FIG. 21 differs from the display device 8000 in FIG. 20 on the arrangement of the processing unit 830 and the printed circuit board assembly 950. The same elements in FIG. 21 as those in FIG. 20 will not be described in detail for brevity. In some embodiments, as shown in FIG. 21, the display device 9000 includes a printed circuit board assembly 950 on the second surface 860B of the substrate 860 and electrically connected to the second conductive layer 822. The processing unit 830 is disposed on and electrically connected to the printed circuit board assembly 950. In some embodiments, the processing unit 830 is electrically connected to the first connective portion 840 through the printed circuit board assembly 950.

In some embodiments, the processing unit is disposed on the backside of the substrate. In some embodiments, the processing unit disposed on the backside of the substrate is electrically connected to the display element layer or the touch electrode layer disposed on the front side of the substrate through the first connective portion penetrating the substrate, and thereby the signal from the processing unit is transmitted. Therefore, the processing unit does not occupy additional area on the front side of the substrate. As a result, a display device that has a narrow border or is borderless is formed. In some embodiments, the gate driver circuit at least partially overlaps the pixel driver circuit. Therefore, the gate driver circuit does not occupy additional area on the front side of the substrate, and a display device that has a narrow border or is borderless is formed. In some embodiments, the display device includes a printed circuit board assembly disposed on the backside of the substrate, and the processing unit is disposed and electrically connected to the printed circuit board assembly. In some embodiments, the processing unit and the printed circuit board assembly can form a COF structure. In some embodiments, the edge of the display device can be bent, and the gate driver circuit can be disposed on the bent portion, thus forming a narrow border or borderless display device.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An electronic device, comprising:
   a first insulating layer;
   a first conductive portion and a second conductive portion, wherein the first conductive portion and the second conductive portion are respectively corresponding to opposite sides of the first insulating layer;
   a first connective portion at least partially disposed in the first insulating layer, wherein the first conductive portion is electrically connected to the second conductive portion through the first connective portion; and
   an integrated circuit and a capacitor, wherein the integrated circuit and the capacitor are respectively corresponding to opposite sides of the first insulating layer, wherein the integrated circuit and the capacitor are overlapped with the first connective portion.

2. The electronic device as claimed in claim 1, wherein a thickness of the capacitor is greater than a thickness of the integrated circuit.

3. The electronic device as claimed in claim 1, wherein the first connective portion comprises a first part and a second part, the first part is closer to the second conductive portion than the second part, and a width of the first part is greater than a width of the second part.

4. The electronic device as claimed in claim 3, wherein the first connective portion further comprises a third part, the second part is between the first part and the third part, and a width of the third part is greater than a width of the second part.

5. The electronic device as claimed in claim 1, further comprising a plurality of first connective portions at least partially disposed in the first insulating layer.

6. The electronic device as claimed in claim 5, wherein the integrated circuit is overlapped with the plurality of first connective portions.

7. The electronic device as claimed in claim 1, wherein a projection area of the integrated circuit onto the first insulating layer is different from a projection area of the capacitor onto the first insulating layer.

8. The electronic device as claimed in claim 1, wherein the electronic device further comprises a second insulating layer overlapped with the first insulating layer and a second connective portion at least partially disposed in the second insulating layer.

9. The electronic device as claimed in claim 8, wherein the second connective portion is overlapped with the first connective portion.

10. The electronic device as claimed in claim 9, wherein a width of the second connective portion is different from a width of the first connective portion.

11. The electronic device as claimed in claim 10, wherein the width of the second connective portion is less than the width of the first connective portion.

12. The electronic device as claimed in claim 8, wherein the electronic device further comprises a third insulating layer, the second insulating layer is between the third insulating layer and the first insulating layer, and the second connective portion at least partially disposed in the third insulating layer.

13. The electronic device as claimed in claim 8, further comprising a plurality of first connective portions at least partially disposed in the first insulating layer and a plurality of second connective portions at least partially disposed in the second insulating layer.

14. The electronic device as claimed in claim 13, wherein the plurality of first connective portions are overlapped with the plurality of second connective portions respectively.

15. The electronic device as claimed in claim 1, wherein a width of the first conductive portion is greater than a width of the first connective portion.

16. The electronic device as claimed in claim 1, wherein a width of the second conductive portion is greater than a width of the first connective portion.

17. The electronic device as claimed in claim 1, wherein the first conductive portion and the integrated circuit are located on a same side of the first insulating layer.

18. The electronic device as claimed in claim 1, wherein the second conductive portion and the capacitor are located on a same side of the first insulating layer.

19. The electronic device as claimed in claim 1, wherein a width of the integrated circuit is greater than a width of the first conductive portion.

20. The electronic device as claimed in claim 1, wherein a width of the integrated circuit is greater than a width of the second conductive portion.

* * * * *